United States Patent
Liu et al.

(10) Patent No.: US 12,142,561 B2
(45) Date of Patent: Nov. 12, 2024

(54) INTEGRATED DEVICE AND INTEGRATED PASSIVE DEVICE COMPRISING MAGNETIC MATERIAL

(71) Applicant: QUALCOMM Incorporated, San Diego, CA (US)

(72) Inventors: Kai Liu, Phoenix, AZ (US); Je-Hsiung Lan, San Diego, CA (US); Jonghae Kim, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 308 days.

(21) Appl. No.: 17/705,041

(22) Filed: Mar. 25, 2022

(65) Prior Publication Data

US 2023/0307355 A1    Sep. 28, 2023

(51) Int. Cl.
*H01L 23/522* (2006.01)
*H01L 49/02* (2006.01)
*H01L 23/00* (2006.01)

(52) U.S. Cl.
CPC ...... *H01L 23/5227* (2013.01); *H01L 23/5222* (2013.01); *H01L 23/5226* (2013.01); *H01L 28/10* (2013.01); *H01L 24/13* (2013.01)

(58) Field of Classification Search
CPC ............. H01L 23/5227; H01L 23/5222; H01L 23/5226; H01L 28/10; H01L 24/13
See application file for complete search history.

(56) References Cited

U.S. PATENT DOCUMENTS

| | | | |
|---|---|---|---|
| 2008/0089043 A1* | 4/2008 | Hirano | H01G 4/40 361/763 |
| 2009/0256667 A1 | 10/2009 | Smeys et al. | |
| 2015/0340422 A1* | 11/2015 | Lee | H01L 24/80 438/3 |
| 2017/0250133 A1 | 8/2017 | Sturcken et al. | |
| 2017/0290156 A1* | 10/2017 | Sturcken | H03H 7/38 |
| 2021/0159163 A1 | 5/2021 | Liff et al. | |

OTHER PUBLICATIONS

International Search Report and Written Opinion—PCT/US2023/064058—ISA/EPO—Jun. 27, 2023.

* cited by examiner

Primary Examiner — Peniel M Gumedzoe

(74) Attorney, Agent, or Firm — Loza & Loza, LLP

(57) ABSTRACT

An integrated device that includes a die substrate comprising a plurality of transistors, an interconnection portion coupled to the die substrate, and a packaging portion coupled to the interconnection portion. The interconnection portion includes at least one die dielectric layer and a plurality of die interconnects coupled to the plurality of transistors. The packaging portion includes at least one magnetic layer and a plurality of metallization interconnects coupled to the plurality of die interconnects.

24 Claims, 21 Drawing Sheets

PROFILE CROSS SECTIONAL VIEW

FIG. 2  PROFILE CROSS SECTIONAL VIEW

PROFILE CROSS SECTIONAL VIEW

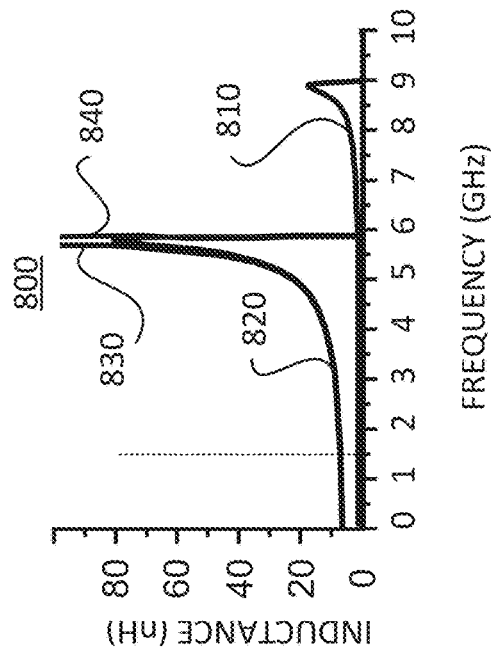
FIG. 8
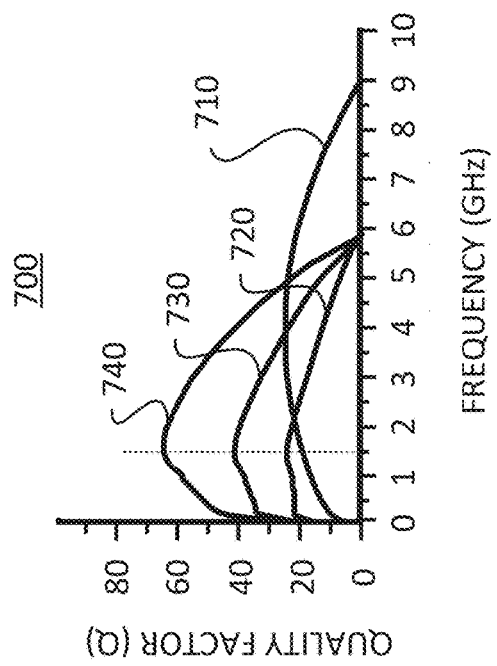
FIG. 7
| INDUCTOR / LINE | W/ Magnetic Material | Permeability (μr) | Loss Tangent | Inductance @ 1.5 GHz | Q-factor @ 1.5 GHz |
|---|---|---|---|---|---|
| 710 / 810 | NO | 1 | 0.01 | 1 nH | 20 |
| 720 / 820 | YES | 10 | 0.04 | 7 nH | 23 |
| 730 / 830 | YES | 10 | 0.02 | 7 nH | 40 |
| 740 / 840 | YES | 10 | 0.01 | 7 nH | 60 |
900
FIG. 9

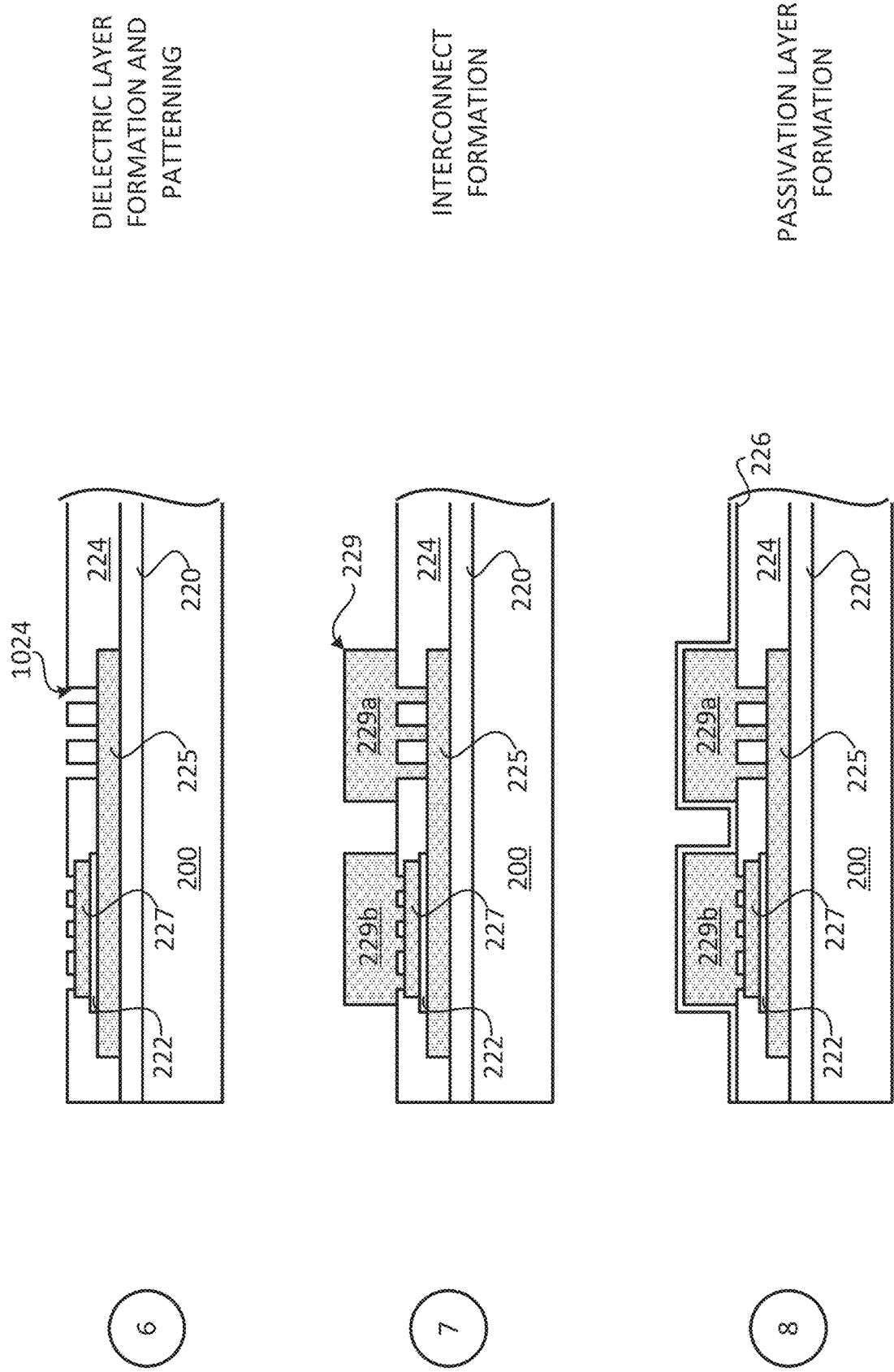

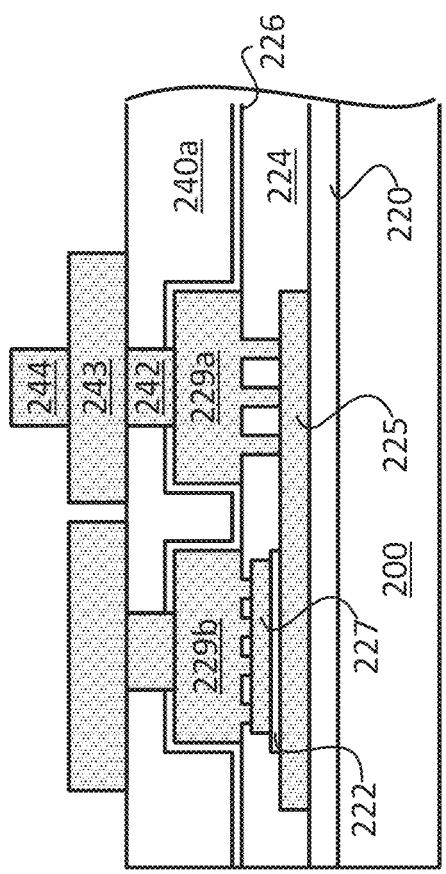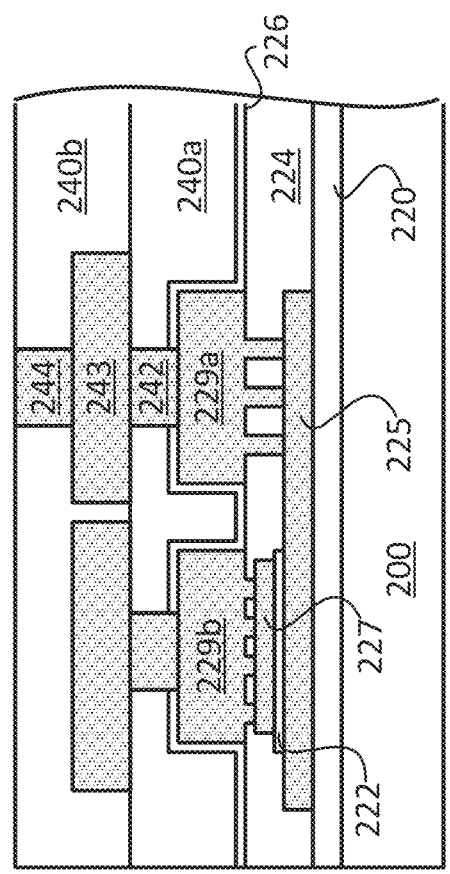
FIG. 10D

1400

```
┌─────────────────────────────────────────────┐
│ PROVIDE SUBSTRATE COMPRISING AT LEAST ONE   │── 1405
│ DIELECTRIC LAYER AND A PLURALITY OF         │
│ INTERCONNECTS                               │
└─────────────────────────────────────────────┘
                      │
                      ▼
┌─────────────────────────────────────────────┐
│ COUPLE INTEGRATED DEVICE(S) AND/OR INTEGRATED│
│ PASSIVE DEVICE(S) TO A FIRST SURFACE OF     │
│ THE SUBSTRATE, WHERE AN INTEGRATED DEVICE AND/│── 1410
│ OR AN INTEGRATED PASSIVE DEVICE INCLUDES A  │
│ MAGNETIC LAYER                              │
└─────────────────────────────────────────────┘
                      │
                      ▼
┌─────────────────────────────────────────────┐
│ COUPLE SOLDER INTERCONNECTS TO THE SUBSTRATE│── 1415
└─────────────────────────────────────────────┘
```

*FIG. 14*

INTEGRATED DEVICE AND INTEGRATED PASSIVE DEVICE COMPRISING MAGNETIC MATERIAL

FIELD

Various features relate to packages, integrated devices and/or integrated passive devices.

BACKGROUND

Packages can include a substrate, an integrated device and integrated passive device. The substrate may include a plurality of interconnects. The integrated device and/or the integrated passive device may be coupled to interconnects of the substrate. There is an ongoing need to provide smaller packages with improved performances.

SUMMARY

Various features relate to packages, integrated devices and/or integrated passive devices.

One example provides an integrated device that includes a die substrate comprising a plurality of transistors, an interconnection portion coupled to the die substrate and a packaging portion coupled to the interconnection portion. The interconnection portion includes at least one die dielectric layer and a plurality of die interconnects coupled to the plurality of transistors. The packaging portion includes at least one magnetic layer and a plurality of metallization interconnects coupled to the plurality of die interconnects.

Another example provides a device that includes a die substrate, an interconnection portion coupled to the die substrate, and a packaging portion coupled to the interconnection portion. The interconnection portion includes at least one die dielectric layer and a plurality of die interconnects. The packaging portion includes at least one magnetic layer and a plurality of metallization interconnects coupled to the plurality of die interconnects.

Another example provides a method that provides a die substrate. The method forms an interconnection portion over the die substrate, where forming the interconnection portion includes forming at least one die dielectric layer and forming a plurality of die interconnects. The method forms a packaging portion over the interconnection portion, where forming the packaging portion includes forming a plurality of metallization interconnects coupled to the plurality of die interconnects and forming at least one magnetic layer.

BRIEF DESCRIPTION OF THE DRAWINGS

Various features, nature and advantages may become apparent from the detailed description set forth below when taken in conjunction with the drawings in which like reference characters identify correspondingly throughout.

FIG. 7 illustrates an exemplary graph of the quality factor of several exemplary inductors at various frequencies.

FIG. 8 illustrates an exemplary graph of the inductance of several exemplary inductors at various frequencies.

FIG. 9 illustrates an exemplary table that illustrates inductances and quality factors of several exemplary inductors.

FIGS. 10A-10I illustrate an exemplary sequence for fabricating an integrated device that includes magnetic material.

FIG. 14 illustrates an exemplary flow diagram of method for fabricating a package that includes a substrate, an integrated device and an integrated passive device.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a substrate and an integrated device coupled to the substrate. The integrated device includes a die substrate comprising a plurality of transistors, an interconnection portion coupled to the die substrate and a packaging portion coupled to the interconnection portion. The interconnection portion includes at least one die dielectric layer and a plurality of die interconnects coupled to the plurality of transistors. The packaging portion includes at least one magnetic layer and a plurality of metallization interconnects coupled to the plurality of die interconnects. The packaging portion includes an inductor that is defined by at least one metallization interconnect from the plurality of metallization interconnects. The at least one magnetic layer includes an insulating layer, a dielectric layer and/or a non-electrical conducting material. The at least one magnetic layer has a permeability value (e.g., relative permeability value) that is greater than 1. The magnetic layer is configured to help improve (e.g., increase) the quality factor (Q) and/or the inductance of the inductor in the packaging portion. As will be further described below, by helping to improve the quality factor and/or the inductance of the inductor, an inductor with a smaller form factor (e.g., size) may be formed in the packaging while still having a quality factor and/or an inductance that is equal or better than that of a larger inductor.

Exemplary Integrated Device Comprising Magnetic Material

Figure 1:
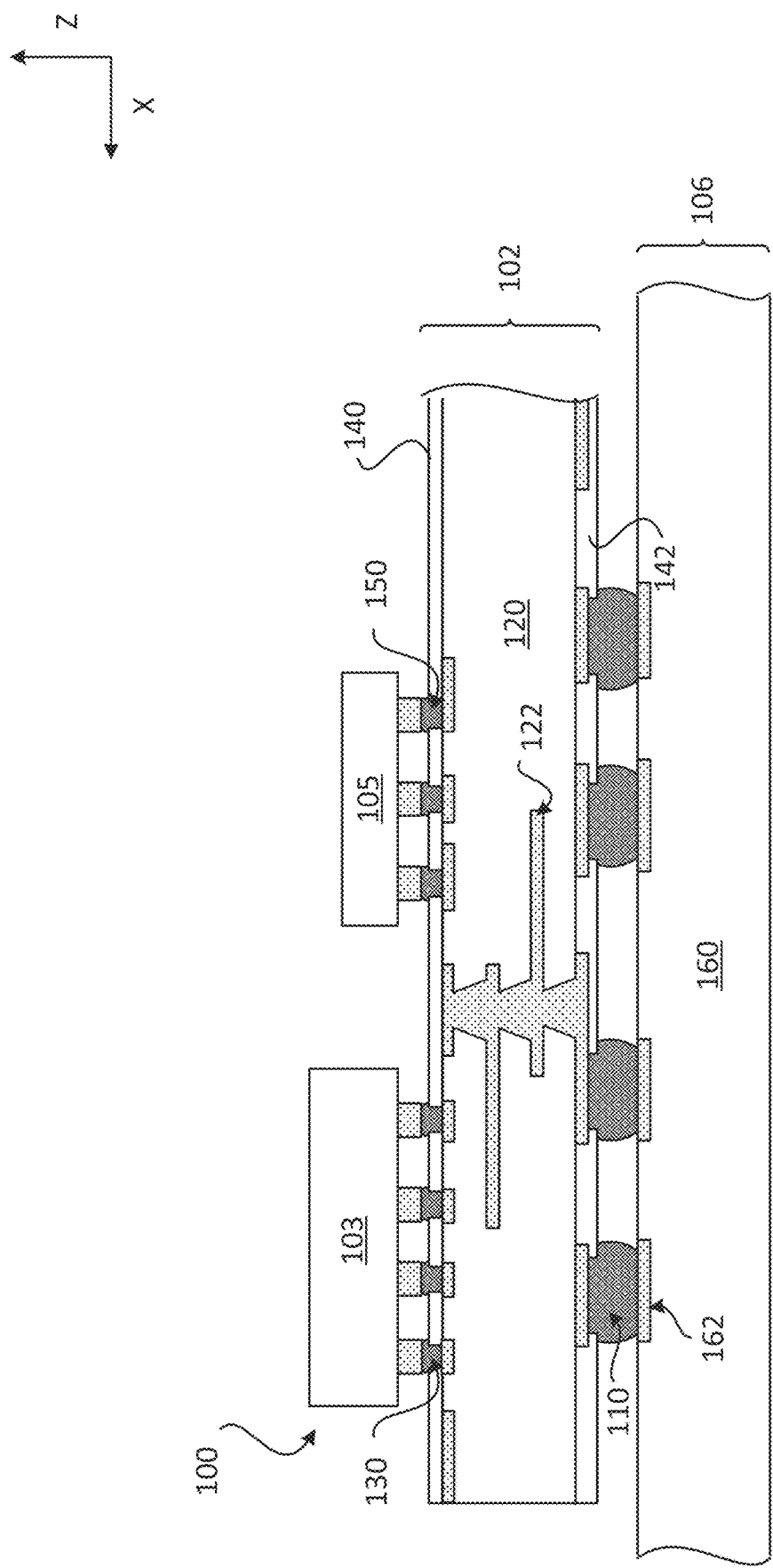
FIG. 1 illustrates an exemplary profile view of a package that includes a substrate, an integrated device and an integrated passive device.

FIG. 1 illustrates a profile view of a package 100 that includes a substrate 102, an integrated device 103 and an integrated passive device 105 (IPD). The package 100 is coupled to a board 106 through a plurality of solder interconnects 110. The board 106 includes at least one board dielectric layer 160 and a plurality of board interconnects 162. The board 106 may include a printed circuit board (PCB).

The substrate 102 includes at least one dielectric layer 120 (e.g., substrate dielectric layer), a plurality of interconnects 122 (e.g., substrate interconnects), a solder resist layer 140 and a solder resist layer 142. The integrated device 103 is coupled to the substrate 102 through a plurality of solder interconnects 130. The integrated passive device 105 is coupled to the substrate 102 through a plurality of solder interconnects 150. A substrate may have a different number of metal layers. Different implementations may use different substrates. The substrate may include an embedded trace substrate (ETS). The at least one dielectric layer 120 may include prepreg.

The package (e.g., 100) may be implemented in a radio frequency (RF) package. The RF package may be a radio frequency front end (RFFE) package. A package (e.g., 100) may be configured to provide Wireless Fidelity (WiFi) communication and/or cellular communication (e.g., 2G, 3G, 4G, 5G). The package (e.g., 100.) may be configured to support Global System for Mobile (GSM) Communications, Universal Mobile Telecommunications System (UMTS), and/or Long-Term Evolution (LTE). The package (e.g., 100) may be configured to transmit and receive signals having different frequencies and/or communication protocols.

As will be further described below, the integrated device 103 and/or the integrated passive device 105 may include at least one magnetic layer. The at least one magnetic layer includes an insulating layer, a dielectric layer and/or a non-electrical conducting material (e.g., material that does not electrically conduct). The at least one magnetic layer has a permeability value that is greater than 1 (e.g., about 10 or greater, range of 6-12). The magnetic layer may have different permeability values at different frequencies. The permeability value of a magnetic material and/or a magnetic layer, as described in the disclosure is a relative permeability value that is defined as a ratio of the permeability of a material to the permeability of free space. Thus, the permeability values that are described for the magnetic materials and/or magnetic layers that are illustrated and/or described in the disclosure may represent a relative permeability value that is relative to a defined permeability value (e.g., reference permeability value) of free space. In some implementations, free space may be defined to have a defined permeability value of $\mu_0 = 4\pi \times 10^{-7}$ H/m (Henry per meter). A material that has a relative permeability value that is greater than 1 may be considered to be a magnetic material.

The at least one magnetic layer is configured to improve the inductance and/or quality factor of an inductor that is located in and/or surrounded by a magnetic layer. With improved inductor performance, smaller and more compact inductors may be formed in the integrated device 103 and/or the integrated passive device 105.

Figure 2:
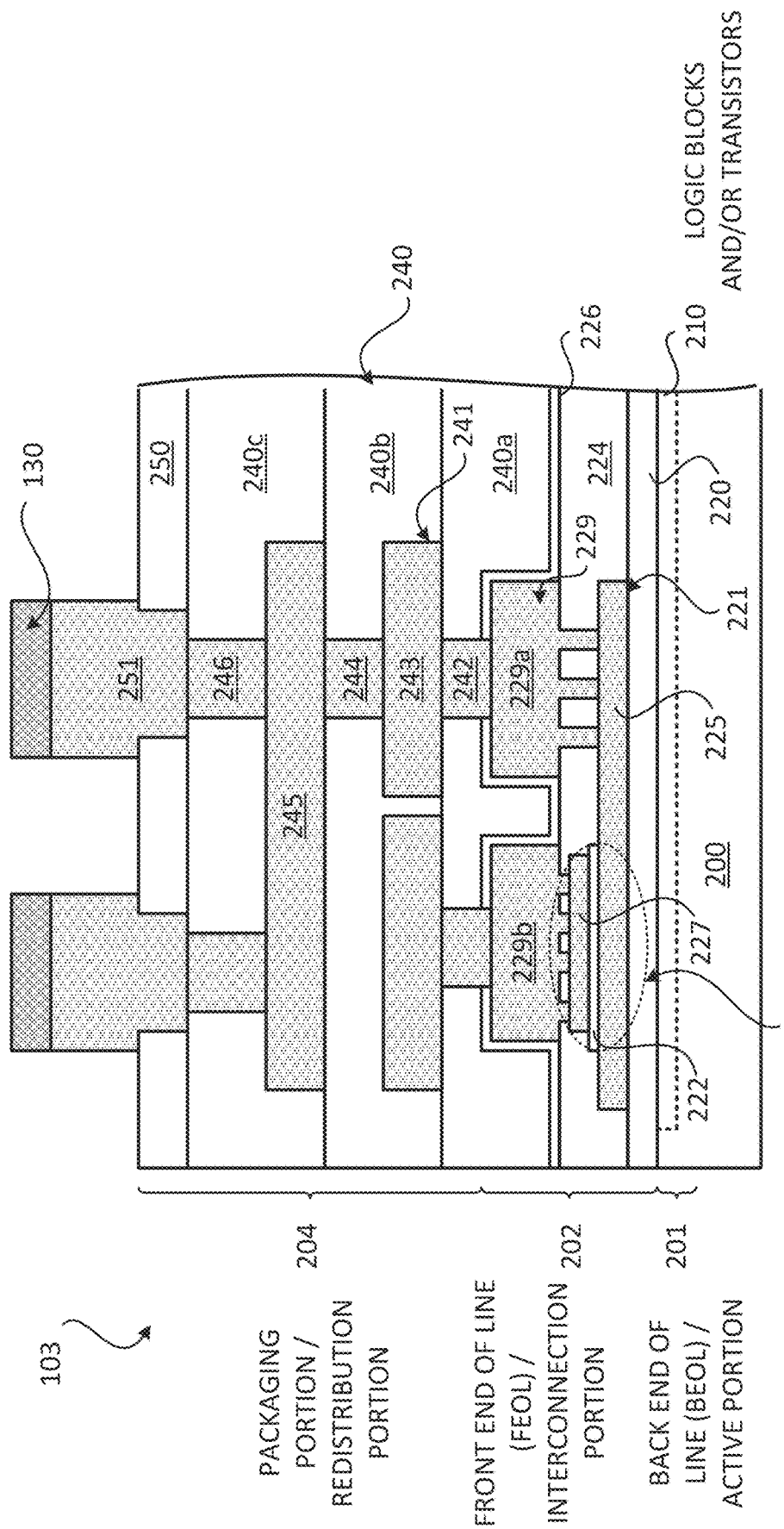
FIG. 2 illustrates an exemplary profile view of an integrated device that includes magnetic material.

FIG. 2 illustrates an exemplary profile cross sectional view of the integrated device 103. The integrated device 103 may include a die (e.g., semiconductor die). The integrated device 103 includes a die substrate 200, a plurality of transistors 210, at least one oxide layer 220, at least one die dielectric layer 224, a plurality of die interconnects 221, a high K dielectric layer 222, a passivation layer 226, at least one magnetic layer 240, a plurality of metallization interconnects 241, a passivation layer 250, a plurality of pillar interconnects 251 and a plurality of solder interconnects 130.

The integrated device 103 may include an active portion 201, an interconnection portion 202 and a packaging portion 204. The active portion 201 may include a back end of line (BEOL) portion. The interconnection portion 202 may be a die interconnection portion. The interconnection portion 202 may include a front end of line (FEOL) portion. The packaging portion 204 may include a redistribution portion (e.g., RDL portion). The interconnection portion 202 is coupled to the active portion 201. The interconnection portion 202 is located over the active portion 201. The packaging portion 204 is coupled to the interconnection portion 202. The packaging portion 204 is located over the interconnection portion 202. The interconnection portion 202 is located between the active portion 201 and the packaging portion 204.

The active portion 201 may include the die substrate 200, the plurality of transistors 210 and/or the at least one oxide layer 220. The plurality of transistors 210 may be formed and/or located in and/or over the die substrate 200. The die substrate 200 may include silicon (Si). The plurality of transistors 210 may form and/or define one or more logical blocks. The at least one oxide layer 220 is located over the die substrate 200 and/or the plurality of transistors 210. The plurality of transistors 210 may be any type of transistors (e.g., CMOS transistors, planar transistors, field effect transistors). The at least one oxide layer 220 may include silicon dioxide. A back end of line (BEOL) process may be used to fabricate and/or form the plurality of transistors 210 and/or the at least one oxide layer 220. The interconnection portion 202 is coupled to the die substrate 200, the plurality of transistors 210 and/or the at least one oxide layer 220.

The interconnection portion 202 may include the plurality of die interconnects 221, the at least one die dielectric layer 224, the high K dielectric layer 222 and/or the passivation layer 226. The plurality of die interconnects 221 may include at least one die interconnect 225, at least one die interconnect 227 and at least one die interconnect 229 (e.g., 229a, 229b). The plurality of die interconnects 221 may be coupled to the plurality of transistors 210. For example, the at least one die interconnect 225 may be coupled (e.g., directly or indirectly) to the plurality of transistors 210. The passivation layer 226 may be located over the at least one die dielectric layer 224 and/or the at least one die interconnect 229 (e.g., 229a, 229b).

The interconnection portion 202 includes a capacitor 203 that is defined by at least a portion of the at least one die interconnect 225, the high K dielectric layer 222 and at least a portion of the at least one die interconnect 227. The capacitor 203 may be located in the at least one die dielectric layer 224. The high K dielectric layer 222 is located between the at least one die interconnect 225 and the at least one die interconnect 227. The high K dielectric layer 222 may have a higher dielectric constant than the dielectric constant of the at least one die dielectric layer 224.

The at least one die interconnect 225 may be located on a first metal layer (M1) of the integrated device, the at least one die interconnect 227 may be located on a second metal layer (M2) of the integrated device, and the at least one die interconnect 229 may be located on a third metal layer (M3) of the integrated device. It is noted that there may be at least one via die interconnect between the first metal layer (M1) and the third metal layer (M3). It is also noted that there may be at least one via die interconnect between the second metal layer (M2) and the third metal layer (M3). The via die interconnect(s) between the first metal layer (M1) and the third metal layer (M3), and the via die interconnect(s) between the second metal layer (M2) and the third metal layer (M3), are considered part of the plurality of die interconnects 221.

The packaging portion 204 includes the plurality of metallization interconnects 241, the at least one magnetic layer 240, the passivation layer 250 and/or the plurality of pillar interconnects 251. A plurality of solder interconnects 130 may be coupled to the plurality of pillar interconnects 251. The plurality of metallization interconnects 241 may include at least one metallization interconnect 242, at least one metallization interconnect 243, at least one metallization interconnect 244, at least one metallization interconnect 245, and/or at least one metallization interconnect 246. The at least one metallization interconnect 243 may be located on a fourth metal layer (M4) of the integrated device and the at least one metallization interconnect 245 may be located on a fifth metal layer (M5) of the integrated device. The at least one metallization interconnect 242 may include via metallization interconnect(s). The at least one metallization interconnect 244 may include via metallization interconnect(s). The at least one metallization interconnect 246 may include via metallization interconnect(s). The plurality of metallization interconnects 241 may include a plurality of redistribution interconnects (e.g., redistribution layer (RDL) interconnects). The passivation layer 250 may be formed and/or located over the at least one magnetic layer 240. The passivation layer 250 may include polyimide (PI). The plurality of metallization interconnects 241 is coupled to the plurality of die interconnects 221. For example, the at least one metallization interconnect 242 is coupled to the at least one die interconnect 229, through one or more openings in the passivation layer 226.

The packaging portion 204 includes at least one inductor that is defined and/or formed from at least one metallization interconnect from the plurality of metallization interconnects 241. For example, the at least one inductor may be defined by the at least one metallization interconnect 243 and/or the at least one metallization interconnect 245. The inductor and/or at least one metallization interconnect from the plurality of metallization interconnects 241 may be located in the at least one magnetic layer 240. The combination of the capacitor 203 in the interconnection portion 202 and the inductor in the packaging portion 204 may be used as a filter for one or more signals.

The at least one magnetic layer 240 includes the magnetic layer 240a, the magnetic layer 240b, the magnetic layer 240c. The at least one magnetic layer 240 includes an insulating layer, a dielectric layer, and/or a non-electrical conducting material. The at least one magnetic layer 240 may be both a dielectric material and a magnetic material. Thus, the at least one magnetic layer 240 may have both dielectric properties and magnetic properties. The at least one magnetic layer 240 may include one or more materials. The at least one magnetic layer 240 has a permeability value that is greater than 1 (e.g., about 10 or greater, range of 6-12). The magnetic layer may have different permeability values at different frequencies. The permeability value of a magnetic material and/or a magnetic layer, as described in the disclosure is a relative permeability value that is defined as a ratio of the permeability of a material to the permeability of free space. Thus, the permeability values that are described for the magnetic materials and/or magnetic layers that are illustrated and/or described in the disclosure may represent a relative permeability value that is relative to a defined permeability value (e.g., reference permeability value) of free space. In some implementations, free space may be defined to have a defined permeability value of $\mu_0=4\pi\times10^{-7}$ H/m (Henry per meter). A material that has a relative permeability value that is greater than 1 may be considered to be a magnetic material. The at least one magnetic layer 240 includes a magnetic loss tangent value that is in a range of about 0.01-0.04. The at least one magnetic layer 240 may include Ajinomoto Magnetic Film (AMF). The at least one magnetic layer 240 surrounds (e.g., partially surrounds, completely surrounds) the inductor and/or the plurality of metallization interconnects 241. For example, the at least one magnetic layer 240 includes a magnetic material (e.g., has magnetic properties) that (i) is touching the inductor and/or the plurality of metallization interconnects 241 and (ii) at least partially surrounds the inductor (or part of the inductor) and/or the plurality of metallization interconnects 241 (or part of the plurality of metallization interconnects 241). The at least one magnetic layer 240 is configured to improve the inductance and/or quality factor of an inductor that is located in and/or surrounded by the at least one magnetic layer 240. With improved inductor performance, smaller and more compact inductors may be formed in the integrated device 103.

The magnetic layer 240a, the magnetic layer 240b, and the magnetic layer 240c may be considered as one magnetic layer or as separate magnetic layers. In some implementations, there may be more or less than 3 magnetic layers. In some implementations, the magnetic layer 240a, the magnetic layer 240b, and the magnetic layer 240c may have the same properties (e.g., same permeability, same magnetic loss tangent value). In some implementations, the magnetic layer 240a, the magnetic layer 240b, and/or the magnetic layer 240c may have the different properties (e.g., different permeability, different magnetic loss tangent value). For example, a first magnetic layer may have a first permeability (e.g., first permeability value, first relative permeability value) and a first magnetic loss tangent value, and a second magnetic layer may have a second permeability (e.g., second permeability value, second relative permeability value) and a second magnetic loss tangent value. In some implementations, the magnetic layer 240a, the magnetic layer 240b, and/or the magnetic layer 240c may have similar and/or the same values for certain properties, and may have different values for other properties. A more detailed description of how the at least one magnetic layer 240 helps improve the performance of an inductor is further described below in at least FIGS. 7-9.

Figure 3:
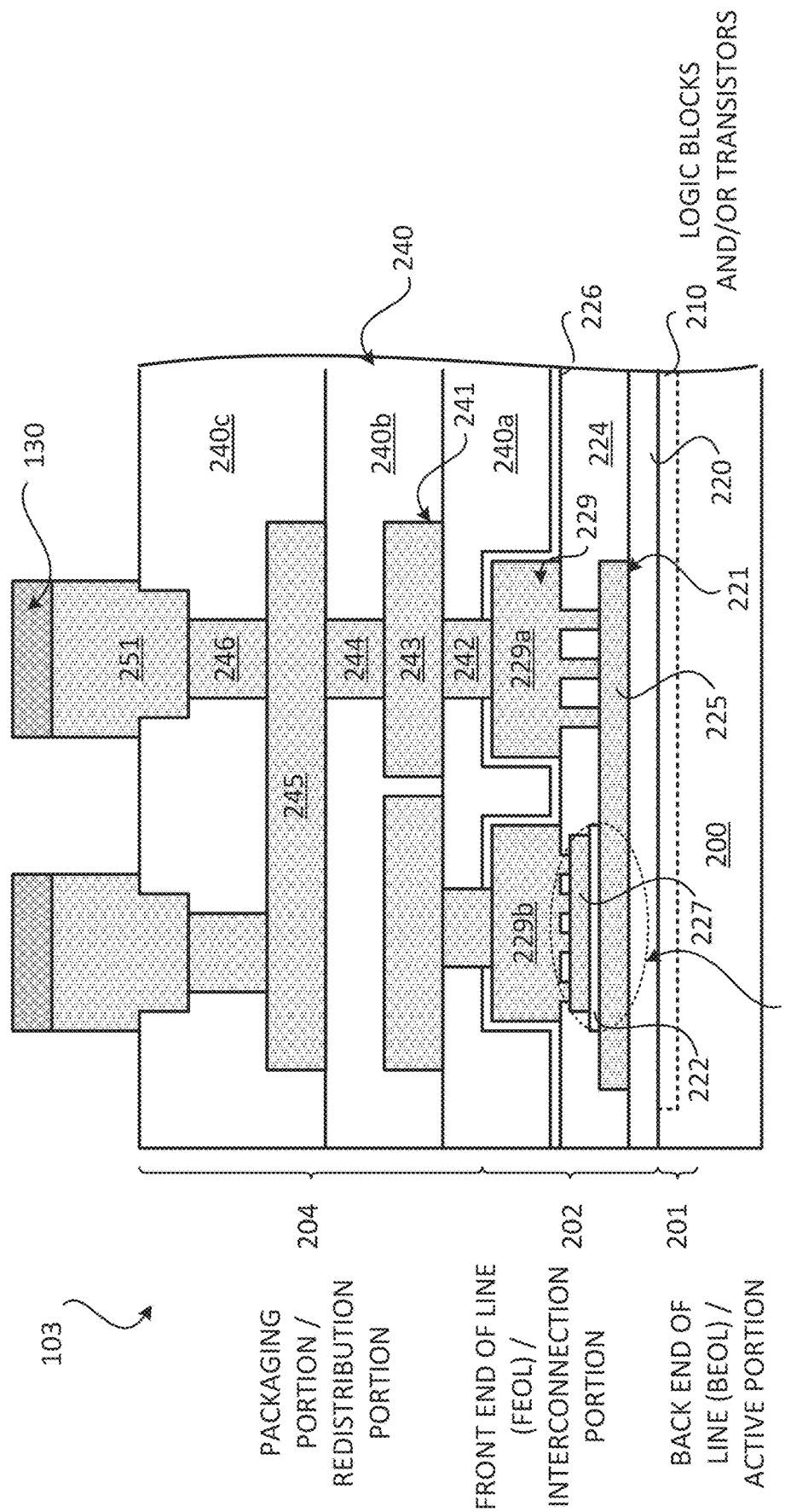
FIG. 3 illustrates another exemplary profile view of an integrated device that includes magnetic material.

FIG. 3 illustrates another exemplary view of the integrated device 103. The integrated device 103 of FIG. 3 is similar to the integrated device 103 of FIG. 2, and as such, includes similar components as the integrated device 103 of FIG. 2. The integrated device 103 of FIG. 3 does not include the passivation layer 250 over the magnetic layer 240c. Moreover, in FIG. 3, the integrated device 103 includes a thicker layer of the magnetic layer 240c.

An integrated device (e.g., 103) may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filters, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 103) may include at least one electronic circuit (e.g., first electronic circuit, second electronic circuit, etc. . . . ). An integrated device may include transistors. An integrated device may be an example of an electrical component and/or electrical device. In some implementations, an integrated device may include a chiplet. A chiplet may be fabricated using a process that provides better yields compared to other processes that are used to fabricate other types of integrated devices, which can lower the overall cost of fabricating a chiplet. Different chiplets may have different sizes and/or shapes. Different chiplets may be configured to provide different functions. Different chiplets may have different interconnect densities (e.g., interconnects with different width and/or spacing). In some implementations, several chiplets may be used to perform the functionalities of one or more chips (e.g., one more integrated devices). Using several chiplets that perform several functions may reduce the overall cost of a package relative to using a single chip to perform all of the functions of a package.

Exemplary Integrated Passive Device (IPD) Comprising Magnetic Material

Figure 4:
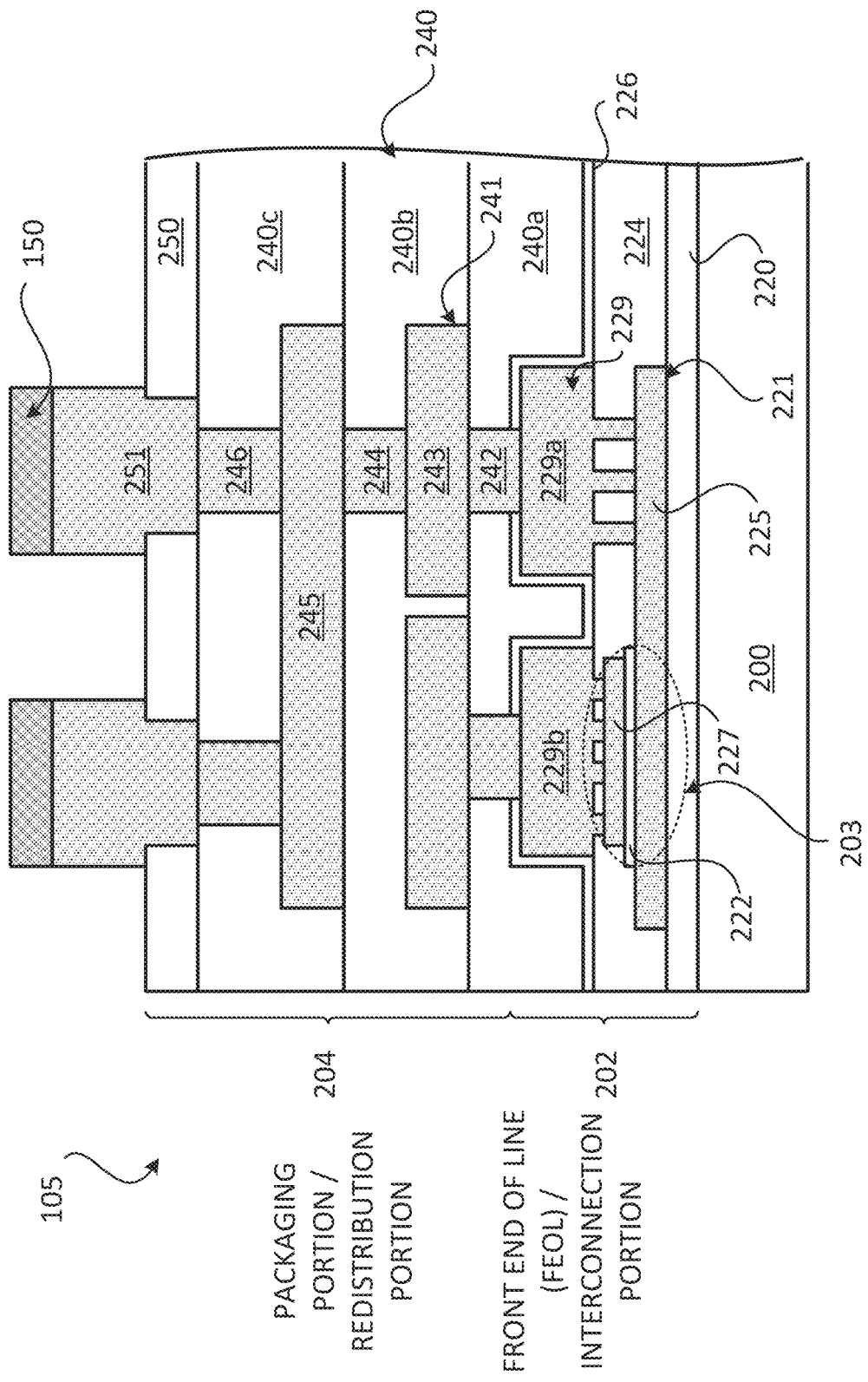
FIG. 4 illustrates an exemplary profile view of an integrated passive device (IPD) that includes magnetic material.

FIG. 4 illustrates an exemplary profile cross sectional view of the integrated passive device 105. The integrated passive device 105 may include a passive die. The integrated passive device 105 includes the die substrate 200, the at least one oxide layer 220, the at least one die dielectric layer 224, the plurality of die interconnects 221, the high K dielectric layer 222, the passivation layer 226, the at least one magnetic layer 240, the plurality of metallization interconnects 241, the passivation layer 250, the plurality of pillar interconnects 251 and a plurality of solder interconnects 150.

The integrated passive device 105 may be similar to the integrated device 103, and thus includes the same or similar components as the integrated device 103. However, the integrated passive device 105 may be free of a plurality of transistors in the die substrate 200. The integrated passive device 105 may not have any active devices in the die substrate 200.

The integrated passive device 105 may include the interconnection portion 202 and the packaging portion 204. The interconnection portion 202 may be a die interconnection portion. The interconnection portion 202 may include a front end of line (FEOL) portion. The packaging portion 204 may include a redistribution portion (e.g., RDL portion). The interconnection portion 202 is coupled to the die substrate 200 and/or the at least one oxide layer 220. The interconnection portion 202 is located over the die substrate 200 and/or the at least one oxide layer 220. The packaging portion 204 is coupled to the interconnection portion 202. The packaging portion 204 is located over the interconnection portion 202. The interconnection portion 202 is located between the die substrate 200 and the packaging portion 204.

The interconnection portion 202 may include the plurality of die interconnects 221, the at least one die dielectric layer 224, the high K dielectric layer 222 and/or the passivation layer 226. The plurality of die interconnects 221 may include at least one die interconnect 225, at least one die interconnect 227 and at least one die interconnect 229 (e.g., 229a, 229b). The passivation layer 226 may be located over the at least one die dielectric layer 224 and/or the at least one die interconnect 229 (e.g., 229a, 229b).

The interconnection portion 202 includes a capacitor 203 that is defined by at least a portion of the at least one die interconnect 225, the high K dielectric layer 222 and at least a portion of the at least one die interconnect 227. The capacitor 203 may be located in the at least one die dielectric layer 224. The high K dielectric layer 222 is located between the at least one die interconnect 225 and the at least one die interconnect 227.

The at least one die interconnect 225 may be located on a first metal layer (M1) of the integrated passive device, the at least one die interconnect 227 may be located on a second metal layer (M2) of the integrated passive device, and the at least one die interconnect 229 may be located on a third metal layer (M3) of the integrated passive device. It is noted that there may be at least one via die interconnect between the first metal layer (M) and the third metal layer (M3). It is also noted that there may be at least one via die interconnect between the second metal layer (M2) and the third metal layer (M3). The via die interconnect(s) between the first metal layer (M1) and the third metal layer (M3), and the via die interconnect(s) between the second metal layer (M2) and the third metal layer (M3), are considered part of the plurality of die interconnects 221.

The packaging portion 204 includes the plurality of metallization interconnects 241, the at least one magnetic layer 240, the passivation layer 250 and/or the plurality of pillar interconnects 251. A plurality of solder interconnects 150 may be coupled to the plurality of pillar interconnects 251. The plurality of metallization interconnects 241 may include at least one metallization interconnect 242, at least one metallization interconnect 243, at least one metallization interconnect 244, at least one metallization interconnect 245, and/or at least one metallization interconnect 246. The at least one metallization interconnect 243 may be located on a fourth metal layer (M4) of the integrated passive device and the at least one metallization interconnect 245 may be located on a fifth metal layer (M5) of the integrated passive device. The at least one metallization interconnect 242 may include via metallization interconnect(s). The at least one metallization interconnect 244 may include via metallization interconnect(s). The at least one metallization interconnect 246 may include via metallization interconnect(s). The plurality of metallization interconnects 241 may include a plurality of redistribution interconnects (e.g., redistribution layer (RDL) interconnects). The passivation layer 250 may be formed and/or located over the at least one magnetic layer 240. The passivation layer 250 may include polyimide (PI). The plurality of metallization interconnects 241 is coupled to the plurality of die interconnects 221. For example, the at least one metallization interconnect 242 is coupled to the at least one die interconnect 229, through one or more openings in the passivation layer 226.

The packaging portion 204 includes at least one inductor that is defined and/or formed from at least one metallization interconnect from the plurality of metallization interconnects 241. For example, the at least one inductor may be defined by the at least one metallization interconnect 243 and/or the at least one metallization interconnect 245. The combination of the capacitor 203 in the interconnection portion 202 and the inductor in the packaging portion 204 may be used as a filter for one or more signals.

The at least one magnetic layer 240 includes the magnetic layer 240a, the magnetic layer 240b, the magnetic layer 240c. The at least one magnetic layer 240 includes an insulating layer, a dielectric layer and/or a non-electrical conducting material. The at least one magnetic layer 240 has a permeability value (e.g., relative permeability value) that is greater than 1 (e.g., about 10). The at least one magnetic layer 240 includes a magnetic loss tangent value that is in a range of about 0.01-0.04. The at least one magnetic layer 240 surrounds the inductor and/or the plurality of metallization interconnects 241. The at least one magnetic layer 240 is configured to improve the inductance and/or quality factor of an inductor that is located in and/or surrounded by the at least one magnetic layer 240. Inductance is related to magnetic energy (through a magnetic field) stored by a conductor and/or an inductor. A conductor and/or an inductor that is surrounded by a magnetic material (e.g., at least one magnetic layer 240) will have more energy stored, and thus the conductor and/or the inductor will have higher inductance. Moreover, the inductor's quality factor (defined by magnetic energy divided by lost energy) is increased, if the lost energy (related to loss-tangent) is not proportionally increased at the same time. With improved inductor performance, smaller and more compact inductors may be formed in the integrated passive device 105. Thus, if an application requires a inductor with a minimum inductance and/or minimum quality factor, a smaller form factor inductor can be provided that is surrounded by the magnetic layer, instead of providing a bigger form factor inductor without the magnetic layer.

In some implementations, the magnetic layer 240a, the magnetic layer 240b, and the magnetic layer 240c may have the same properties (e.g., same permeability, same magnetic loss tangent value). In some implementations, the magnetic layer 240a, the magnetic layer 240b, and/or the magnetic layer 240c may have the different properties (e.g., different permeability, different magnetic loss tangent value). For example, a first magnetic layer may have a first permeability (e.g., first permeability value, first relative permeability value) and a first magnetic loss tangent value, and a second magnetic layer may have a second permeability (e.g., second permeability value, second relative permeability value) and a second magnetic loss tangent value. In some implementations, the magnetic layer 240a, the magnetic layer 240b, and/or the magnetic layer 240c may have similar and/or the same values for certain properties, and may have different values for other properties.

Figure 5:
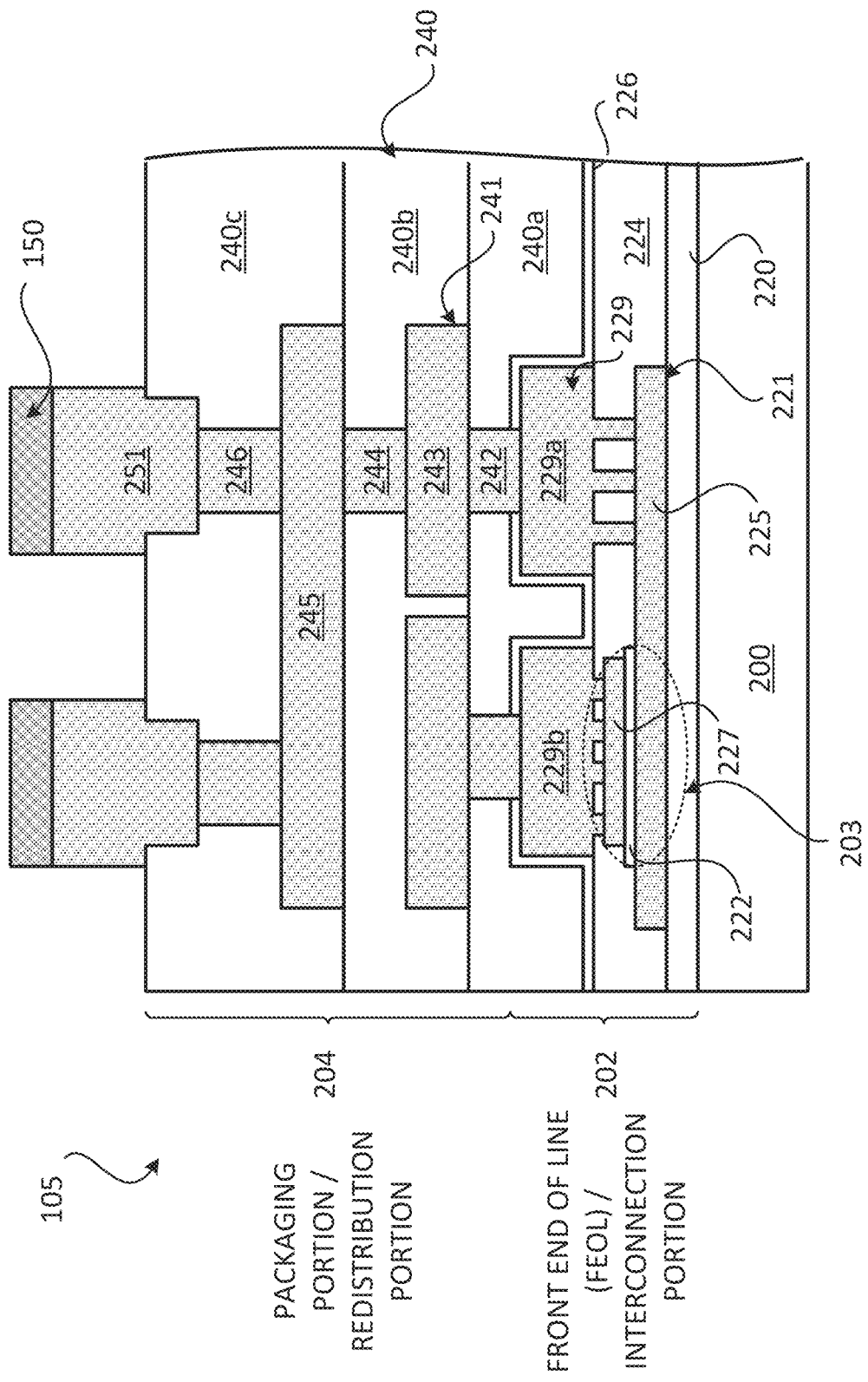
FIG. 5 illustrates another exemplary profile view of an integrated passive device (IPD) that includes magnetic material.

FIG. 5 illustrates another exemplary view of the integrated passive device 105. The integrated passive device 105 of FIG. 5 is similar to the integrated passive device 105 of FIG. 4, and as such, includes similar components as the integrated passive device 105 of FIG. 4. The integrated passive device 105 of FIG. 5 does not include the passivation layer 250 over the magnetic layer 240c. Moreover, in FIG. 5, the integrated passive device 105 includes a thicker layer of the magnetic layer 240c.

Figure 6:
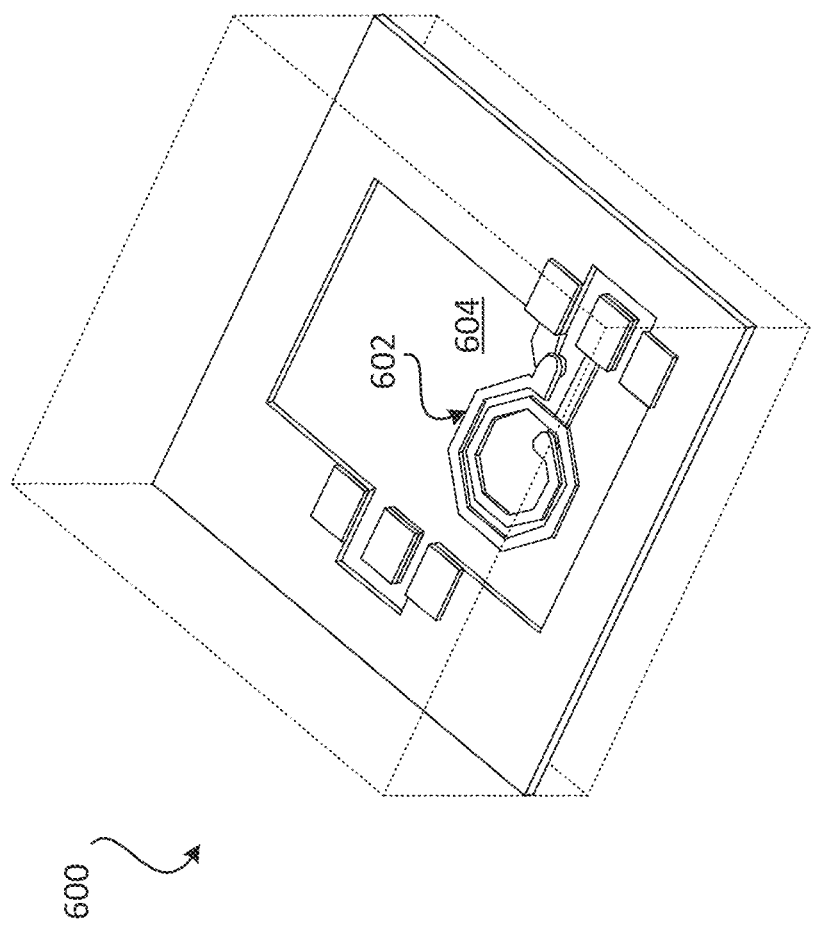
FIG. 6 illustrates an exemplary view of a device that includes an inductor located in magnetic material.

FIG. 6 illustrates a device 600 that includes an inductor 602 and at least one magnetic layer 604. The device 600 may represent the integrated device 103 and/or the integrated passive device 105. The inductor 602 may be formed in a packaging portion of the device 600. The inductor 602 may be formed and/or defined by at least one metallization interconnect in the packaging portion of the device 600. The inductor 602 may be surrounded by the at least one magnetic layer 604. The at least one magnetic layer 604 may be similar and/or the same as the at least one magnetic layer 240. It is noted that the device 600 may include more than one inductor. The inductors may have different shapes, sizes, windings, configurations and/or placements. The inductors may be located on one or more metal layers (e.g., metallization layers) of the device 600.

FIG. 7 illustrates an exemplary graph 700 that shows the quality factor (Q) of several inductors across an exemplary frequency. The graph 700 includes a first plot line 710 for a first inductor, a second plot line 720 for a second inductor, a third plot line 730 for a third inductor and a fourth plot line 740 for a fourth inductor.

FIG. 8 illustrates an exemplary graph 800 that shows the inductance of several inductors across an exemplary frequency. The graph 800 includes a first plot line 810 for the first inductor, a second plot line 820 for the second inductor, a third plot line 830 for the third inductor and a fourth plot line 840 for the fourth inductor.

The first inductor, the second inductor, the third inductor and the fourth inductor have the same design. However, each of the first inductor, the second inductor, the third inductor and the fourth inductor is surrounded by a different dielectric layer with different properties.

FIG. 9 illustrates an exemplary table 900 that shows the various inductances and quality factors for the first inductor, the second inductor, the third inductor and the fourth inductor at a particular frequency.

The first inductor (which is associated with the first plot line 710 and the first plot line 810) is not surrounded by a magnetic material and is instead surrounded by a non-magnetic dielectric material that has a loss tangent (e.g., electric loss tangent) of 0.01, which results in an inductance of 1 nanohenry (nH) at 1.5 GHz, and a quality factor (Q) of 20 at 1.5 GHz. The second inductor (which is associated with the second plot line 720 and the second plot line 820) is surrounded by a magnetic material having a permeability of 10 and a loss tangent (e.g., magnetic loss tangent) of 0.04, which results in an inductance of 7 nH at 1.5 GHz, and a quality factor (Q) of 23 at 1.5 GHz. The third inductor (which is associated with the third plot line 730 and the third plot line 830) is surrounded by a magnetic material having a permeability of 10 and a loss tangent (e.g., magnetic loss tangent) of 0.02, which results in an inductance of 7 nH at 1.5 GHz, and a quality factor (Q) of 40 at 1.5 GHz. The fourth inductor (which is associated with the fourth plot line 740 and the fourth plot line 840) is surrounded by a magnetic material having a permeability of 10 and a loss tangent (e.g., magnetic loss tangent) of 0.01, which results in an inductance of 7 nH at 1.5 GHz, and a quality factor (Q) of 60 at 1.5 GHz.

Thus, the examples above demonstrate that the magnetic layer can improve the inductance of an inductor by a factor of 7. One advantage of a more effective and/or powerful inductor design is that smaller and more compact inductors may be provided in an integrated device and/or an integrated passive device, while still meeting the design and/or performance requirements of the integrated device and/or the integrated passive device. This can help reduce the overall size and/or form of the integrated device and/or the integrated passive device.

It is noted that the graphs and values shown in FIGS. 7-9 are exemplary. Different implementations may have the same, similar or different values across the same or different frequencies. For example, the permeability value of the magnetic layer (e.g., magnetic dielectric layer) of 10 is exemplary. Other magnetic layers with other permeability values (e.g., relative permeability values) of greater than 1 may be used (e.g., 1, 6.5, 7, 8, 11). It is noted that a magnetic layer may have different permeability values for different frequencies.

Having described various integrated devices and/or integrated passive devices with at least one magnetic layer, a process for fabricating an integrated device with at least one magnetic layer will be described below.

Exemplary Sequence for Fabricating an Integrated Device Comprising Magnetic Layer FIGS. 10A-10I illustrate an exemplary sequence for providing or fabricating an integrated device comprising at least one magnetic layer. In some implementations, the sequence of FIGS. 10A-10I may be used to provide or fabricate the integrated device 103 described in the disclosure.

It should be noted that the sequence of FIGS. 10A-10I may combine one or more stages in order to simplify and/or clarify the sequence for providing or fabricating an integrated device. In some implementations, the order of the processes may be changed or modified. In some implementations, one or more of processes may be replaced or substituted without departing from the spirit of the disclosure. Different implementations may fabricate an integrated device differently. It is noted that the sequence of FIGS. 10A-10I may be used to fabricate an integrated passive device (e.g., 105) comprising at least one magnetic layer. The sequence shown in FIGS. 10A-10I may be implemented on a wafer (e.g., silicon wafer) and then singulated into several integrated devices. A similar approach may be implemented for integrated passive devices.

Figure 10A:
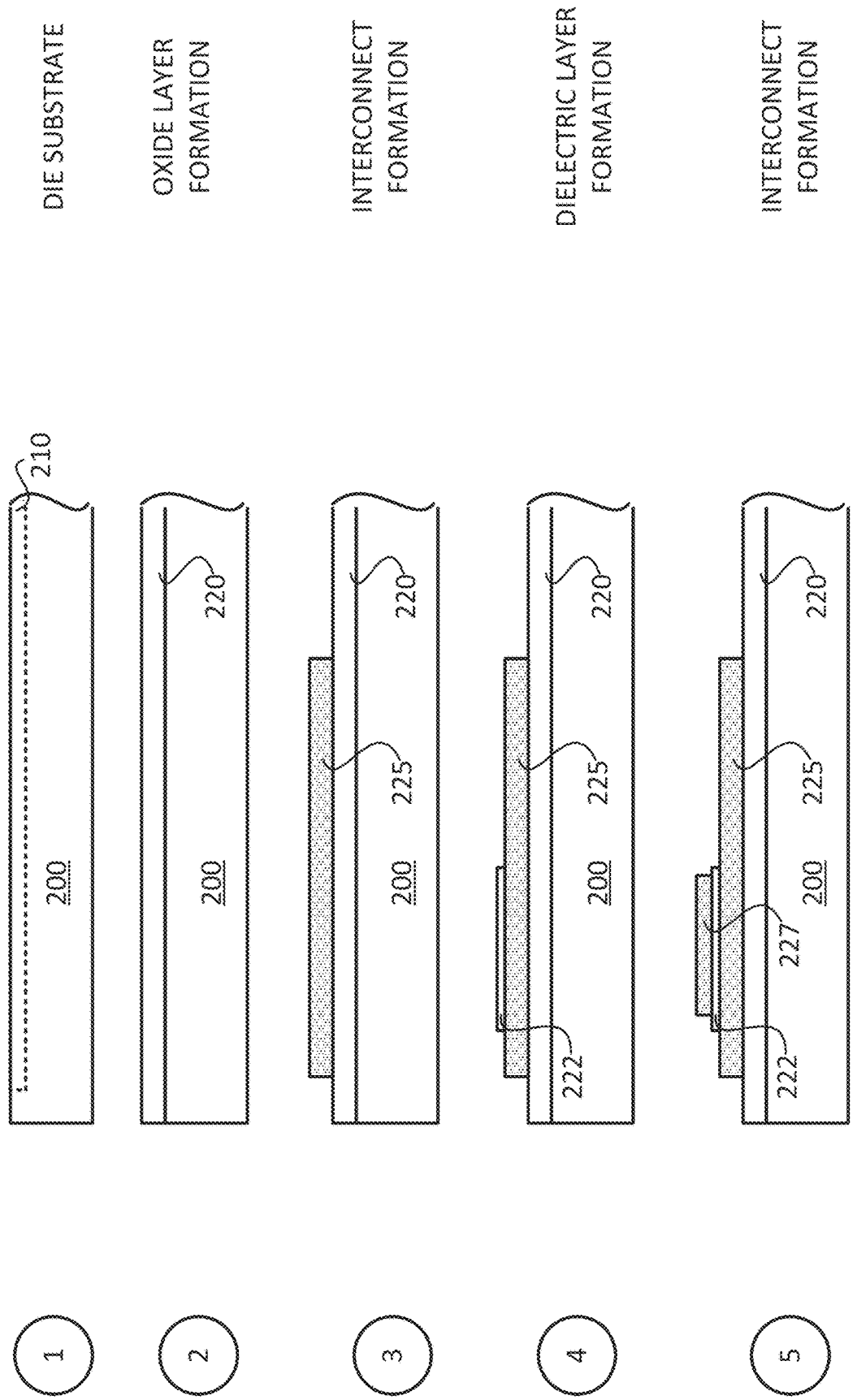

Stage 1, as shown in FIG. 10A, illustrates a state after a die substrate 200 is provided. The die substrate 200 may include silicon (Si). A plurality of transistors 210 may be formed in and/or over the die substrate 200. A BEOL process may be used to fabricate the plurality of transistors 210. Providing the die substrate 200 may include providing a wafer (e.g., silicon wafer).

Stage 2 illustrates a state after at least one oxide layer 220 is formed over the die substrate 200 and/or the plurality of transistors 210. The at least one oxide layer 220 may include silicon dioxide. A deposition and/or a lamination process may be used to form the at least one oxide layer 220. The at least one oxide layer 220 may be formed from plasma enhanced Tetraethyl orthosilicate (PE TEOS). In some implementations, the at least one oxide layer 220 may already be formed when the die substrate 200 is provided at stage 1.

Stage 3 illustrates a state after the at least one die interconnect 225 is formed over the at least one oxide layer 220. The at least one die interconnect 225 may be formed over the die substrate 200 and/or the plurality of transistors 210. The at least one die interconnect 225 may be coupled (e.g., directly or indirectly) to the plurality of transistors 210 through one or more openings in the at least one oxide layer 220. A plating process and a patterning process may be used to form the at least one die interconnect 225.

Stage 4 illustrates a state after a high K dielectric layer 222 is formed over at least a portion of the at least one die interconnect 225. The high K dielectric layer 222 may include silicon nitride. A deposition, a lamination and/or a patterning process may be used to form the high K dielectric layer 222.

Stage 5 illustrates a state after the at least one die interconnect 227 is formed over the at least one high K dielectric layer 222. A plating process and a patterning process may be used to form the at least one die interconnect 227. At least a portion of the at least one die interconnect 225, the high K dielectric layer 222 and the at least one die interconnect 227 may form and/or define a capacitor.

Stage 6, as shown in FIG. 10B, illustrates a state after at least one die dielectric layer 224 is formed and patterned. A deposition, a lamination, an exposure, a development and/or an etching process may be used to form and pattern the at least one die dielectric layer 224. The at least one die dielectric layer 224 may be formed over and around the at least one die interconnect 225 and the at least one die interconnect 227. The at least one die dielectric layer 224 may include a plurality of cavities 1024. The at least one die dielectric layer 224 may be formed such that the at least one die interconnect 225, the high K dielectric layer 222 and the at least one die interconnect 227 are located in the at least one die dielectric layer 224.

Stage 7 illustrates a state after the at least one die interconnect 229 is formed over the at least one die dielectric layer 224. A plating process and a patterning process may be used to form the at least one die interconnect 229. Forming the at least one die interconnect 229 may include forming via die interconnects in the at least one die dielectric layer 224 (e.g., in the cavities 1024 of the at least one die dielectric layer 224). The via die interconnect(s) may be considered part of the at least one die interconnect 229. The at least one die interconnect 229 may be coupled to the at least one die interconnect 225 and the at least one die interconnect 227.

Stage 8 illustrates a state after a passivation layer 226 is formed over the at least one die interconnect 229 and/or the at least one die dielectric layer 224. The passivation layer 226 may include silicon dioxide and/or silicon nitride. A deposition and/or a lamination process may be used to form the passivation layer 226.

Figure 10C:
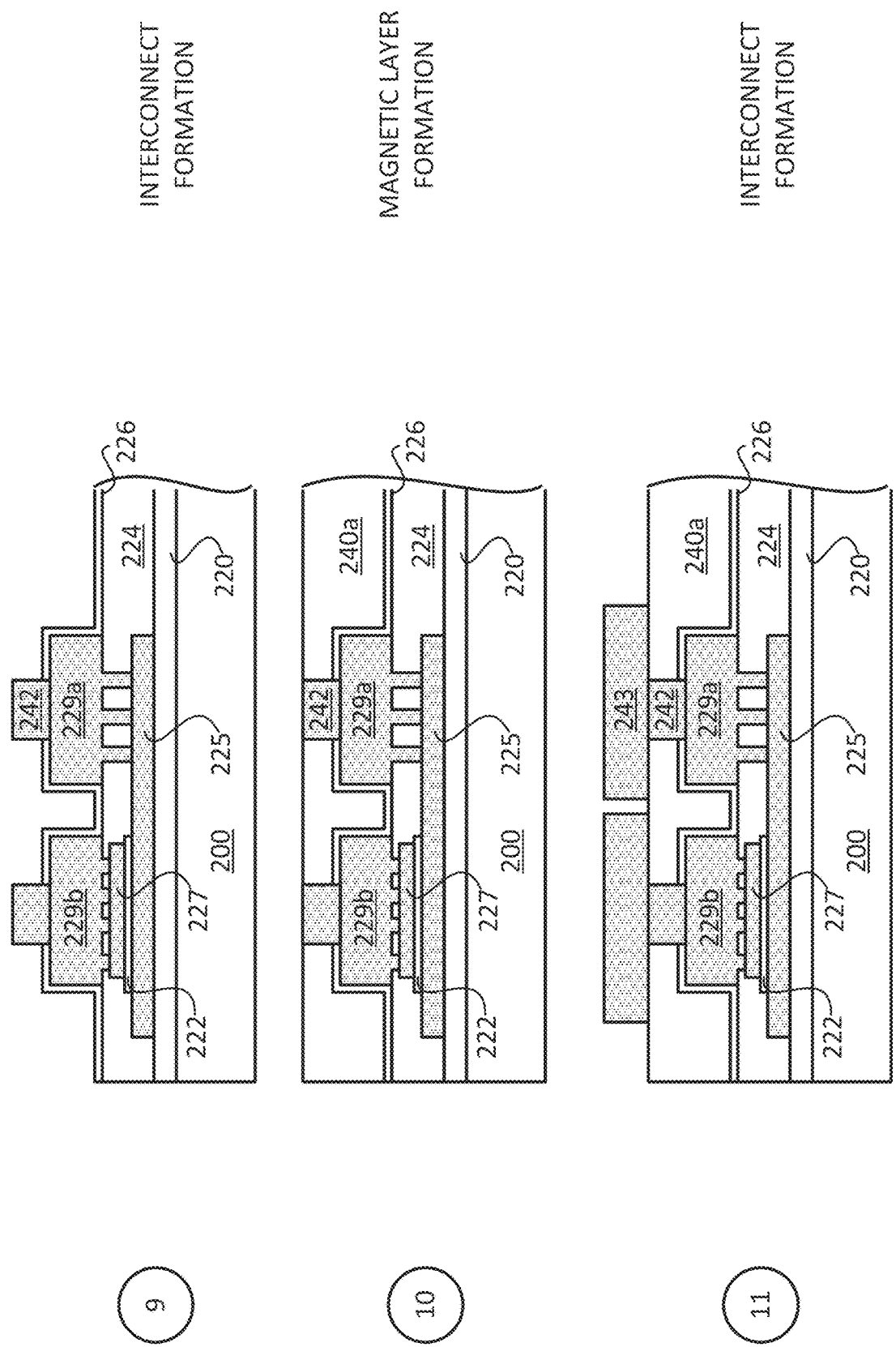

Stage 9, as shown in FIG. 10C, illustrates a state after the at least one metallization interconnect 242 is formed through at least one opening in the passivation layer 226. A plating process and a patterning process may be used to form the at least one metallization interconnect 242. The at least one metallization interconnect 242 may be coupled to the at least one die interconnect 229.

Stage 10 illustrates a state after a magnetic layer 240a is formed over the passivation layer 226 and the at least one metallization interconnect 242. A lamination process may be used to form the magnetic layer 240a. A grinding process may be used to remove portions of the magnetic layer 240a and expose the at least one metallization interconnect 242. Portions of the at least one metallization interconnect 242 may also be grinded.

Stage 11 illustrates a state after the at least one metallization interconnect 243 is formed over the at least one metallization interconnect 242 and the magnetic layer 240a. A plating process and a patterning process may be used to form the at least one metallization interconnect 243. The at least one metallization interconnect 243 is coupled to the at least one metallization interconnect 242.

Stage 12, as shown in FIG. 10D, illustrates a state after the at least one metallization interconnect 244 is formed over the at least one metallization interconnect 243. A plating process and a patterning process may be used to form the at least one metallization interconnect 245. The at least one metallization interconnect 244 is coupled to the at least one metallization interconnect 243.

Stage 13 illustrates a state after a magnetic layer 240b is formed over the at least one metallization interconnect 243, the at least one metallization interconnect 244 and the magnetic layer 240a. A lamination process may be used to form the magnetic layer 240b. A grinding process may be used to remove portions of the magnetic layer 240b and expose the at least one metallization interconnect 244. Portions of the at least one metallization interconnect 244 may also be grinded.

Figure 10E:
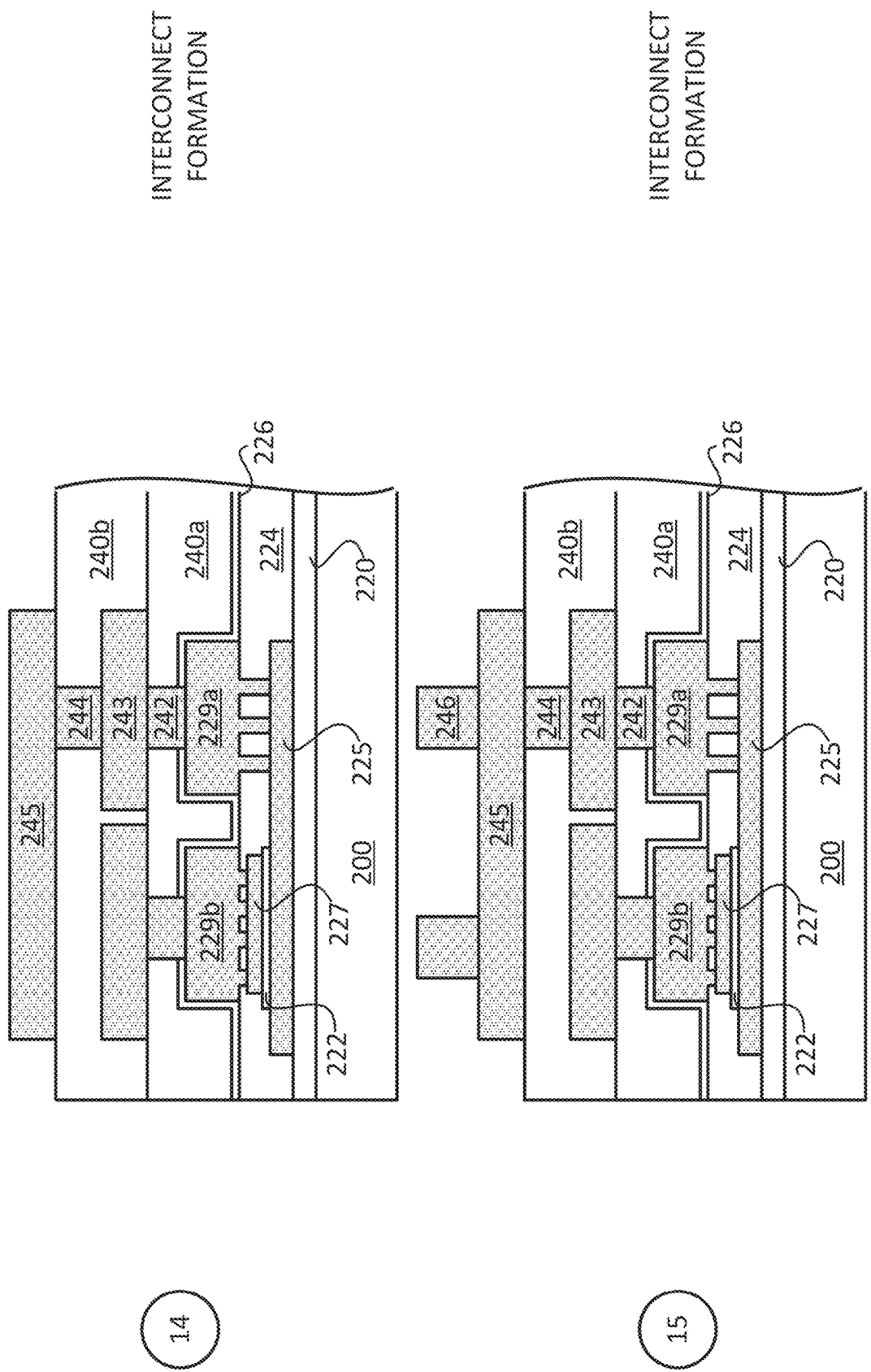

Stage 14, as shown in FIG. 10E, illustrates a state after the at least one metallization interconnect 245 is formed over the at least one metallization interconnect 244 and the magnetic layer 240b. A plating process and a patterning process may be used to form the at least one metallization interconnect 245. The at least one metallization interconnect 245 is formed over the at least one metallization interconnect 244.

Stage 15 illustrates a state after the at least one metallization interconnect 246 is formed over the at least one metallization interconnect 245. A plating process and a patterning process may be used to form the at least one metallization interconnect 246. The at least one metallization interconnect 246 is coupled to the at least one metallization interconnect 245.

Figure 10F:
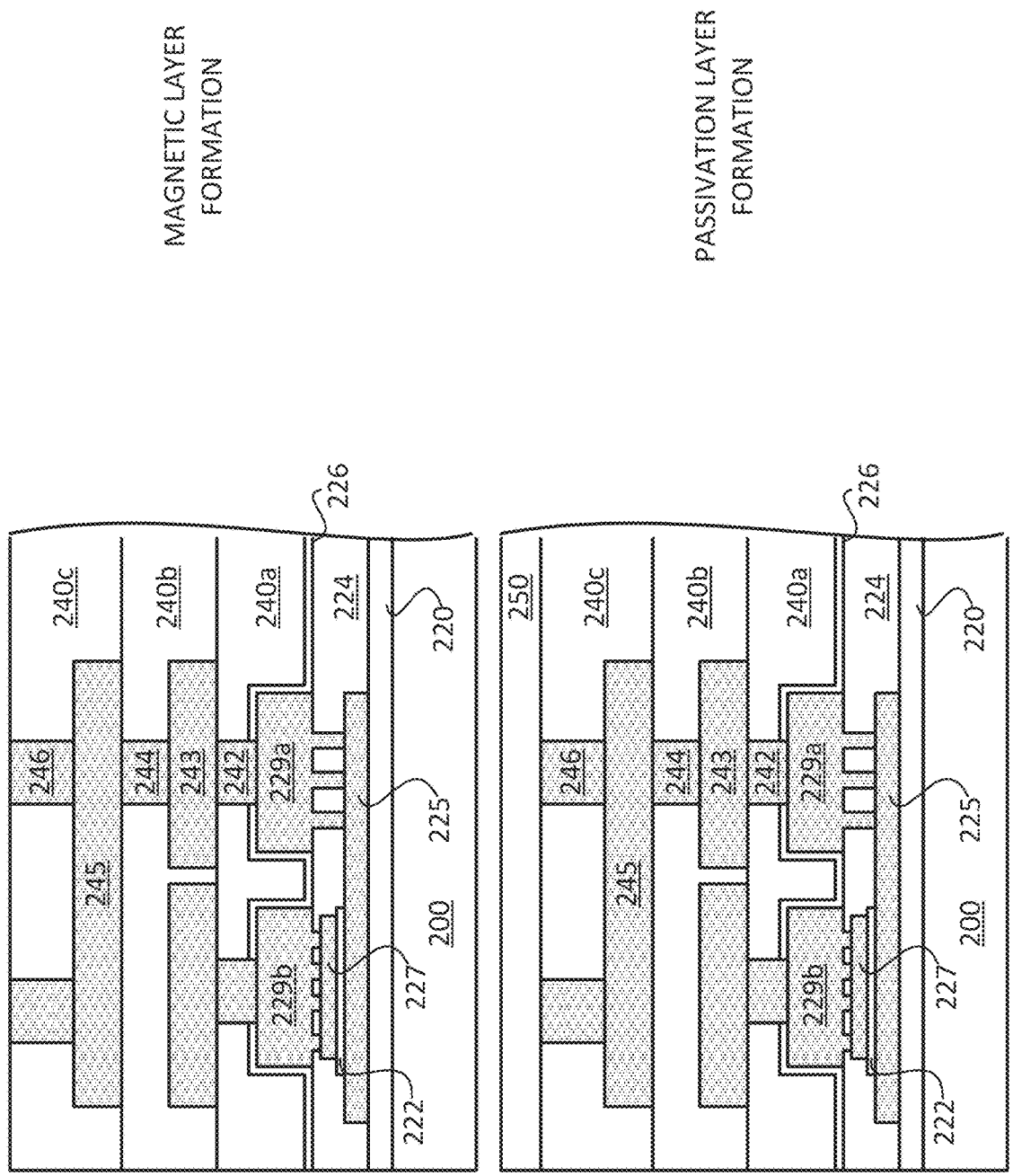

Stage 16, as shown in FIG. 10F, illustrates a state after the magnetic layer 240c is formed over the at least one metallization interconnect 245, the at least one metallization interconnect 246 and the magnetic layer 240b. A lamination process may be used to form the magnetic layer 240c. A grinding process may be used to remove portions of the magnetic layer 240c and expose the at least one metallization interconnect 246. Portions of the at least one metallization interconnect 246 may also be grinded. The magnetic layer 240a, the magnetic layer 240b and/or the magnetic layer 240c may be the same magnetic layer (e.g., include the same magnetic material) or may be magnetic layers with different properties (e.g., different permeability values).

Stage 17 illustrates a state after a passivation layer 250 is formed over the at least one metallization interconnect 246 and/or the magnetic layer 240c. The passivation layer 250 may include polyimide (PI). A deposition and/or lamination process may be used to form the passivation layer 250.

Figure 10G:
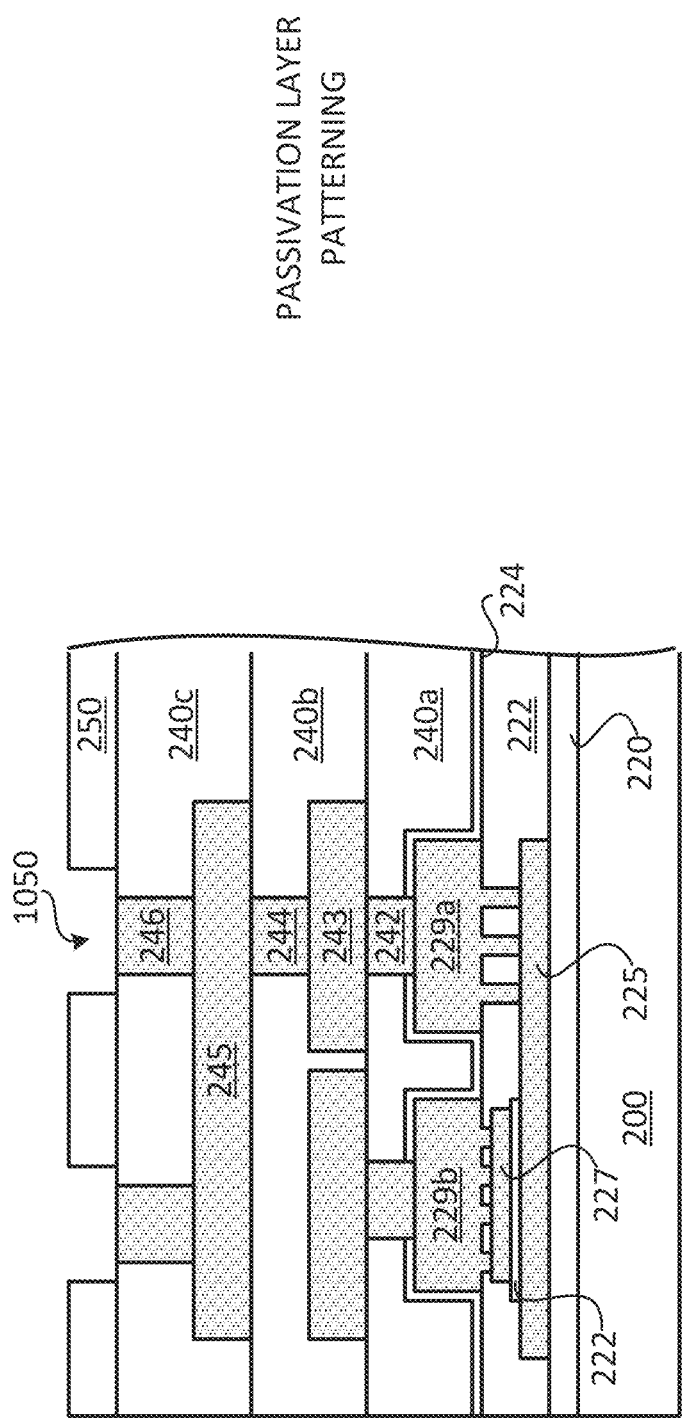

Stage 18, as shown in FIG. 10G, illustrates a state after openings 1050 in the passivation layer 250 are formed. An exposure, a development and/or an etching process may be used to form the openings 1050.

Figure 10H:
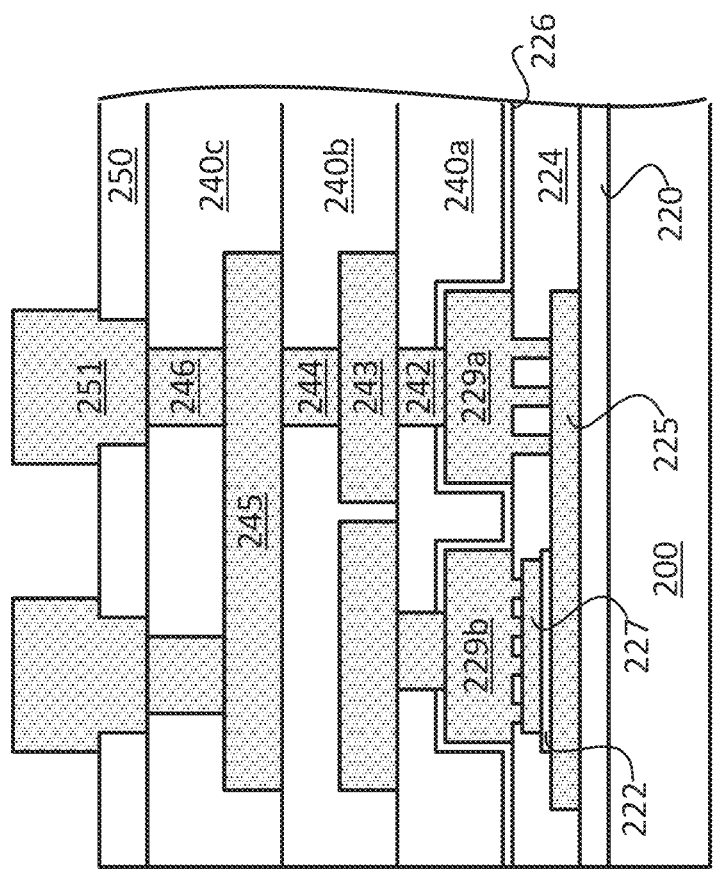

Stage 19, as shown in FIG. 10H illustrates a state after the plurality of pillar interconnects 251 are formed over the at least one metallization interconnect 246 through the openings 1050 of the passivation layer 250. A plating process and a patterning process may be used to form the plurality of pillar interconnects 251. Some part of the plurality of pillar interconnects 251 may be considered part of the at least one metallization interconnect.

Figure 10I:
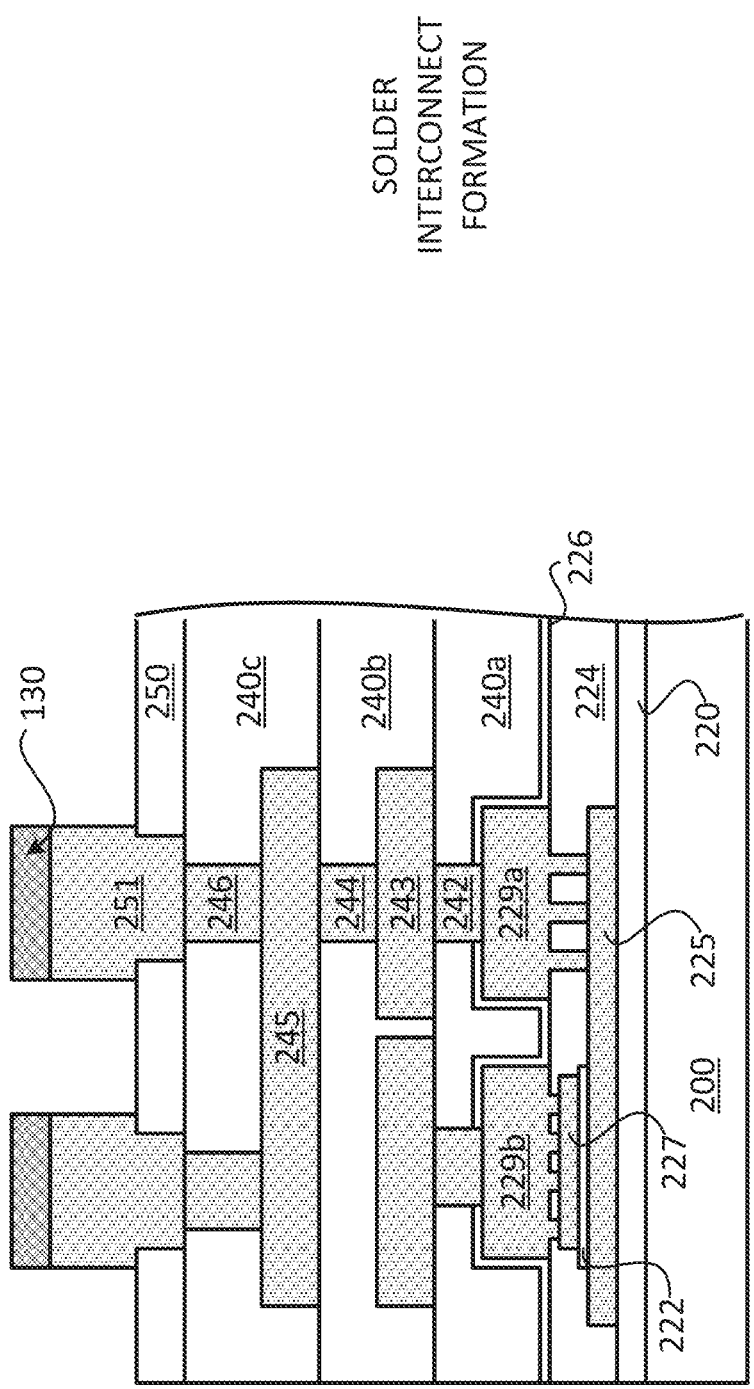

Stage 20, as shown in FIG. 10I, illustrates a state after a plurality of solder interconnects 130 are formed over the plurality of pillar interconnects 251. A solder reflow process may be used to form the plurality of solder interconnects 130.

As mentioned above, the above sequence may be fabricated on wafer (e.g., silicon wafer) such that several integrated devices are formed at the same time, and the wafer is then singulated to form individual integrated devices comprising a magnetic layer. The above sequence may be fabricated in one facility or at several facilities. For example, a wafer that includes the active portion 201 and the interconnection portion 202 may be provided, and a packaging portion 204 may be fabricated over the interconnection portion 202. The wafer comprising the active portion 201, the interconnection portion 202 and the packaging portion 204 may be singulated to form several integrated devices.

Figure 11:
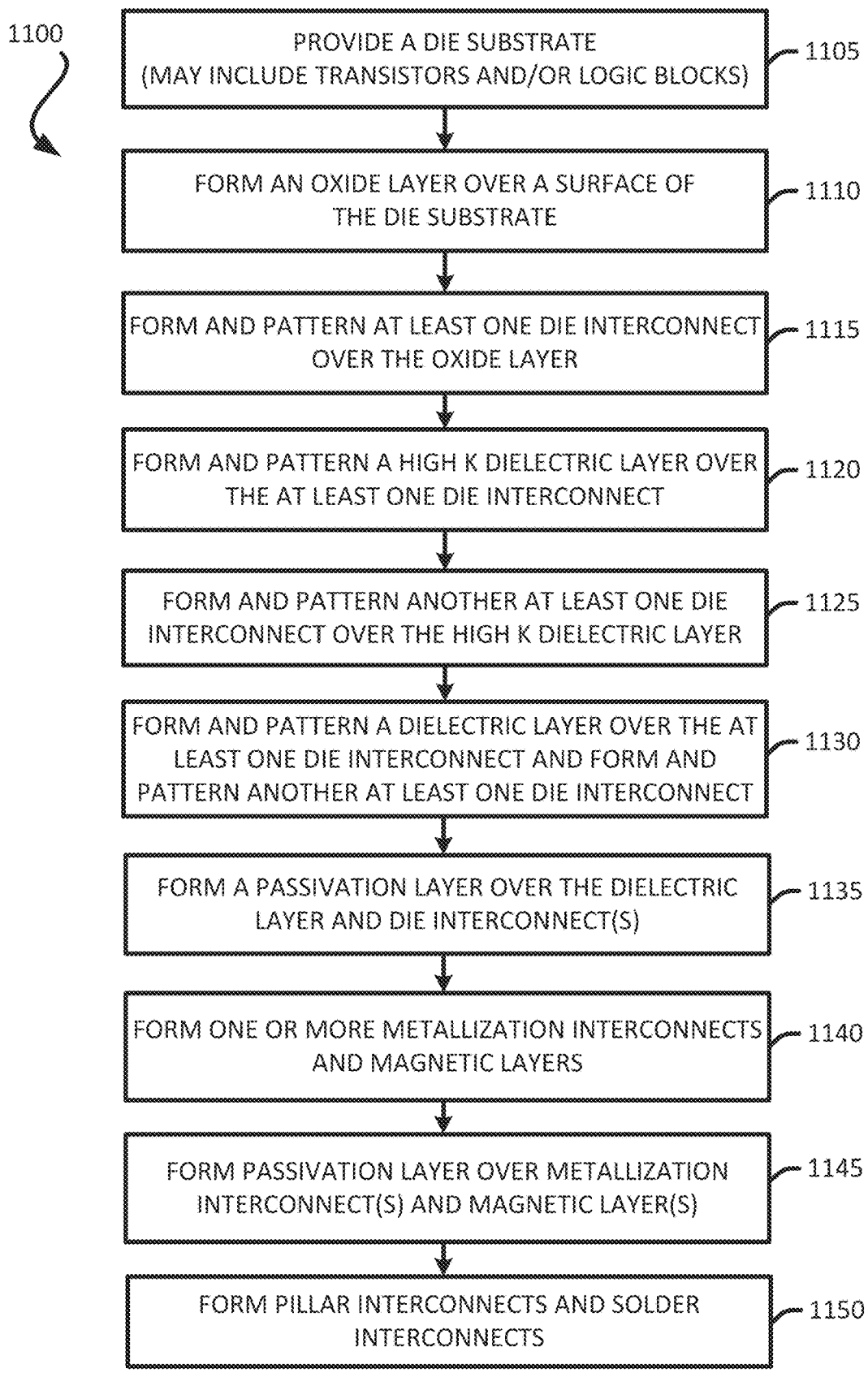
FIG. 11 illustrates an exemplary flow diagram of a method for fabricating an integrated device that includes magnetic material.

Exemplary Flow Diagram of a Method for Fabricating an Integrated Device Comprising Magnetic Layer In some implementations, fabricating an integrated device includes several processes. FIG. 11 illustrates an exemplary flow diagram of a method 1100 for providing or fabricating an integrated device that includes at least one magnetic layer. In some implementations, the method 1100 of FIG. 11 may be used to provide or fabricate the integrated device 103. The method 1100 may be implemented on a wafer (e.g., silicon wafer) and then singulated into several integrated devices.

It should be noted that the method 1100 of FIG. 11 may combine one or more processes in order to simplify and/or clarify the method for providing or fabricating an integrated device. In some implementations, the order of the processes may be changed or modified. Moreover, the method 1100 of FIG. 11 may be implemented to provide or fabricate an integrated passive device (e.g., 105) with at least one magnetic layer.

The method provides (at 1105) a die substrate (e.g., 200). The die substrate 200 may include silicon (Si). The die substrate 200 may include a wafer (e.g., silicon wafer). A plurality of transistors 210 may be formed in and/or over the die substrate 200. A plurality of logic blocks may be formed and/or defined by the plurality of transistors 210. A BEOL process may be used to fabricate the plurality of transistors 210. When fabricating an integrated passive device, the die substrate 200 may be free of the plurality of transistors (e.g., free of active devices). Stage 1 of FIG. 10A, illustrates and describes an example of providing a die substrate.

The method forms (at 1110) at least one oxide layer (e.g., 220) over the die substrate 200 and/or the plurality of transistors 210. The at least one oxide layer 220 may include silicon dioxide. A deposition and/or a lamination process may be used to form the at least one oxide layer 220. The at least one oxide layer 220 may be formed from plasma enhanced Tetraethyl orthosilicate (PE TEOS). In some implementations, the at least one oxide layer 220 may already be formed when the die substrate 200 is provided (at 1105). Stage 2 of FIG. 10A, illustrates and describe an example of at least one oxide layer formed over a die substrate 200 and/or a plurality of transistors.

The method forms and patterns (at 1115) at least one die interconnect (e.g., 225) over an oxide layer. The at least one die interconnect 225 may be formed over the die substrate 200 and/or the plurality of transistors 210. The at least one die interconnect 225 may be coupled to the plurality of transistors 210 through one or more openings in the at least one oxide layer 220. A plating process and patterning process may be used to form the at least one die interconnect 225. Stage 3 of FIG. 10A, illustrates and describes an example of at least one die interconnect formed over an oxide layer.

The method forms and patterns (at 1120) at least one high K dielectric layer over a portion of the at least one die interconnect 225. The high K dielectric layer 222 may include silicon nitride. A deposition, a lamination and/or a patterning process may be used to form the high K dielectric layer 222. Stage 4 of FIG. 10A, illustrates and describes an example of a high K dielectric layer formed over at least a portion of a die interconnect.

The method forms and patterns (at 1125) at least one die interconnect (e.g., 227) over a high K dielectric layer. A plating process and a patterning process may be used to form the at least one die interconnect 227. At least a portion of the at least one die interconnect 225, the high K dielectric layer 222 and the at least one die interconnect 227 may form and/or define a capacitor. Stage 5 of FIG. 10A, illustrates and describes an example of a die interconnect formed over a high K dielectric layer.

The method forms and patterns (at 1130) at least one die dielectric layer (e.g., 224). The at least one die dielectric layer 224 may be formed over and around the at least one die interconnect 225 and the at least one die interconnect 227. The at least one die dielectric layer 224 may include a plurality of cavities 1024. A deposition, a lamination, an exposure, a development and/or an etching process may be used to form and pattern the at least one die dielectric layer 224. Stage 6 of FIG. 10B, illustrates and describes an example of forming and patterning a die dielectric layer.

The method also forms and patterns (at 1130) at least one die interconnect (e.g., 229) over at least one die dielectric layer 224. A plating process and a patterning process may be used to form the at least one die interconnect 229. The at least one die interconnect 229 may be coupled to other die interconnects. Stage 7 of FIG. 10B illustrates and describes an example of a die interconnect formed over a die dielectric layer.

The method forms (at 1135) a passivation layer (e.g., 226) over at least one die interconnect 229 and at least one die dielectric layer 224. The passivation layer 226 may include silicon dioxide and/or silicon nitride. A deposition and/or lamination process may be used to form the passivation layer 226. Stage 8 of FIG. 10B, illustrates and describes an example of a passivation layer formed over a die interconnect and a die dielectric layer.

The method forms and patterns (at 1140) at least one metallization interconnect (e.g., 242). A plating process and a patterning process may be used to form the at least one metallization interconnect 242. Stage 9 of FIG. 10C, illustrates and describes an example of a metallization interconnect formed through at least one opening in the passivation layer. The method also forms (at 1140) a magnetic layer (e.g., 240a) over the passivation layer 226 and the at least one metallization interconnect 242. A lamination process may be used to form the magnetic layer 240a. A grinding process may be used to remove portions of the magnetic layer 240a and expose the at least one metallization interconnect 242. Portions of the at least one metallization interconnect 242 may also be grinded. Stage 10 of FIG. 10C, illustrates and describes an example of a magnetic layer formed over a passivation layer and a metallization interconnect. The method may iteratively repeat (at 1140) the process of (i) forming and patterning metallization interconnects and (ii) forming and grinding a magnetic layer, for as many layers are required. Stages 11 through 16 of FIGS. 10C-IOF illustrate and describe examples of iteratively forming metallization interconnects and magnetic layers.

The method forms (at 1145) a passivation layer (e.g., 250) over the at least one metallization interconnect (e.g., 246) and/or the magnetic layer (e.g., 240c). The passivation layer 250 may include polyimide (PI). A deposition and/or lamination process may be used to form the passivation layer 250. Stage 17 of FIG. 10F, illustrates and describes a passivation layer formed over a metallization interconnect and a magnetic layer. The method also forms (at 1145) openings (e.g., 1050) in the passivation layer (e.g., 250). An exposure, a development and/or an etching process may be used for form the openings 1050. Stage 18 of FIG. 10G, illustrates and describes an example of openings in a passivation layer.

The method forms (at 1150) a plurality of pillar interconnects (e.g., 251) over metallization interconnect(s). A plating process and a patterning process may be used to form the plurality of pillar interconnects 251. Some part of the plurality of pillar interconnects 251 may be considered part of the at least one metallization interconnect. Stage 19 of FIG. 10H, illustrates and describes an example of a plurality of pillar interconnect formed over a metallization interconnect through an opening of a passivation layer.

The method also forms (at 1150) a plurality of solder interconnects (e.g., 130). The plurality of solder interconnects 130 may be coupled to the plurality of pillar interconnects 251. A solder reflow process may be used to form the plurality of solder interconnects 130. Stage 20 of FIG. 10I, illustrates and describes a plurality of solder interconnects formed over a plurality of pillar interconnects.

As mentioned above, the method 1100 may be fabricated on wafer (e.g., silicon wafer) such that several integrated devices are formed at the same time, and the wafer is then singulated to form individual integrated devices comprising a magnetic layer.

Figure 12:
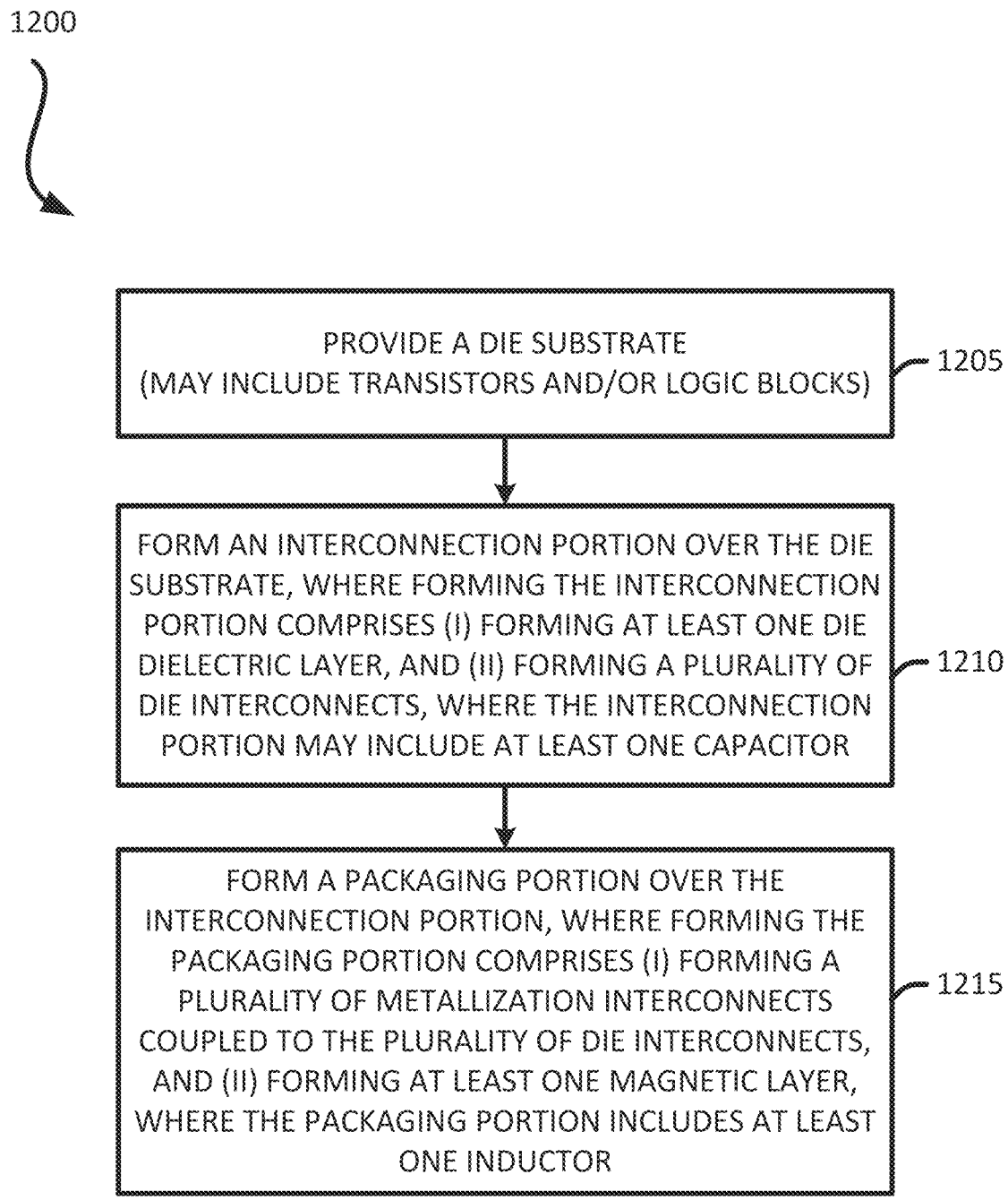
FIG. 12 illustrates another exemplary flow diagram of a method for fabricating an integrated device that includes magnetic material.

Exemplary Flow Diagram of a Method for Fabricating an Integrated Device Comprising Magnetic Layer In some implementations, fabricating an integrated device includes several processes. FIG. 12 illustrates an exemplary flow diagram of a method 1200 for providing or fabricating an integrated device that includes at least one magnetic layer. In some implementations, the method 1200 of FIG. 12 may be used to provide or fabricate the integrated device 103. The method 1200 may be implemented on a wafer (e.g., silicon wafer) and then singulated into several integrated devices.

It should be noted that the method 1200 of FIG. 12 may combine one or more processes in order to simplify and/or clarify the method for providing or fabricating an integrated device. For example, one or more of the processes of the method 1200 may include one or more of the processes of the method 1100. In some implementations, the order of the processes may be changed or modified. Moreover, the method 1200 of FIG. 12 may be implemented to provide or fabricate an integrated passive device (e.g., 105) with at least one magnetic layer.

The method provides (at 1205) a die substrate (e.g., 200). The die substrate 200 may include silicon (Si). The die substrate 200 may include a wafer (e.g., silicon wafer). A plurality of transistors 210 may be formed in and/or over the die substrate 200. A plurality of logic blocks may be formed and/or defined by the plurality of transistors 210. A BEOL process may be used to fabricate the plurality of transistors 210. The die substrate 200 may be part of and/or define an active portion (e.g., 201) of an integrated device. When fabricating an integrated passive device, the die substrate 200 may be free of the plurality of transistors (e.g., free of active devices). Stage 1 of FIG. 10A, illustrates and describes an example of providing a die substrate.

The method forms (at 1210) an interconnection portion (e.g., 202) over the die substrate (e.g., 200)., where forming the interconnection portion 202 includes forming at least one die dielectric layer and forming a plurality of die interconnects. The interconnection portion 202 may be coupled to the die substrate 200.

Forming the interconnection portion 202 may include forming at least one oxide layer (e.g., 220) over the die substrate 200 and/or the plurality of transistors 210, forming and patterning at least one die interconnect (e.g., 225) over an oxide layer, forming and patterning at least one high K dielectric layer over a portion of the at least one die interconnect 225, forming and patterning at least one die interconnect (e.g., 227) over a high K dielectric layer, forming and patterning at least one die dielectric layer (e.g., 224), forming and patterning at least one die interconnect (e.g., 229) over at least one die dielectric layer 224 and/or forming a passivation layer (e.g., 226) over at least one die interconnect 229 and at least one die dielectric layer 224.

The interconnection portion 202 may include a capacitor that is defined by at least some die interconnects from the plurality of die interconnects. Forming the interconnection portion 202 may include the processes 1110 through 1135 of the method 1100 of FIG. 11. Stage 2 through 8 of FIGS. 10A-10B, illustrate an example of forming an interconnection portion.

The method forms (at 1215) a packaging portion (e.g., 204) over the interconnection portion (e.g., 202), where forming the packaging portion 204 includes forming a plurality of metallization interconnects coupled to the plurality of die interconnects, and forming at least one magnetic layer. The packaging portion 204 may be coupled to the interconnection portion 202.

Forming the packaging portion may include forming and patterning at least one metallization interconnect (e.g., 242), forming a magnetic layer (e.g., 240*a*) over the passivation layer 226 and the at least one metallization interconnect 242, grinding portions of the magnetic layer 240*a* and exposing the at least one metallization interconnect 242 (portions of the at least one metallization interconnect 242 may also be grinded), forming a passivation layer (e.g., 250) over the at least one metallization interconnect (e.g., 246) and/or the magnetic layer, forming a plurality of pillar interconnects (e.g., 251) over metallization interconnect(s) and/or forming a plurality of solder interconnects. It is noted that the plurality of solder interconnects may or may not be considered part of the packaging portion of an integrated device and/or and integrated passive device.

The packaging portion 204 may include an inductor that is defined by at least one metallization interconnect from the plurality of metallization interconnects. The at least one magnetic layer includes an insulating layer, a dielectric layer, and/or a non-electrical conducting material. The at least one magnetic layer has a permeability value (e.g., relative permeability value) that is greater than 1.

The method may iteratively repeat the process of (i) forming and patterning metallization interconnects and (ii) forming and grinding a magnetic layer, for as many layers are required. Forming the packaging portion 204 may include the processes 1140 through 1150 of the method 1100 of FIG. 11. Stage 9 through 20 of FIGS. 10C-10I, illustrate an example of forming a packaging portion.

As mentioned above, the method 1200 may be fabricated on wafer (e.g., silicon wafer) such that several integrated devices are formed at the same time, and the wafer is then singulated to form individual integrated devices comprising a magnetic layer.

Figure 13:
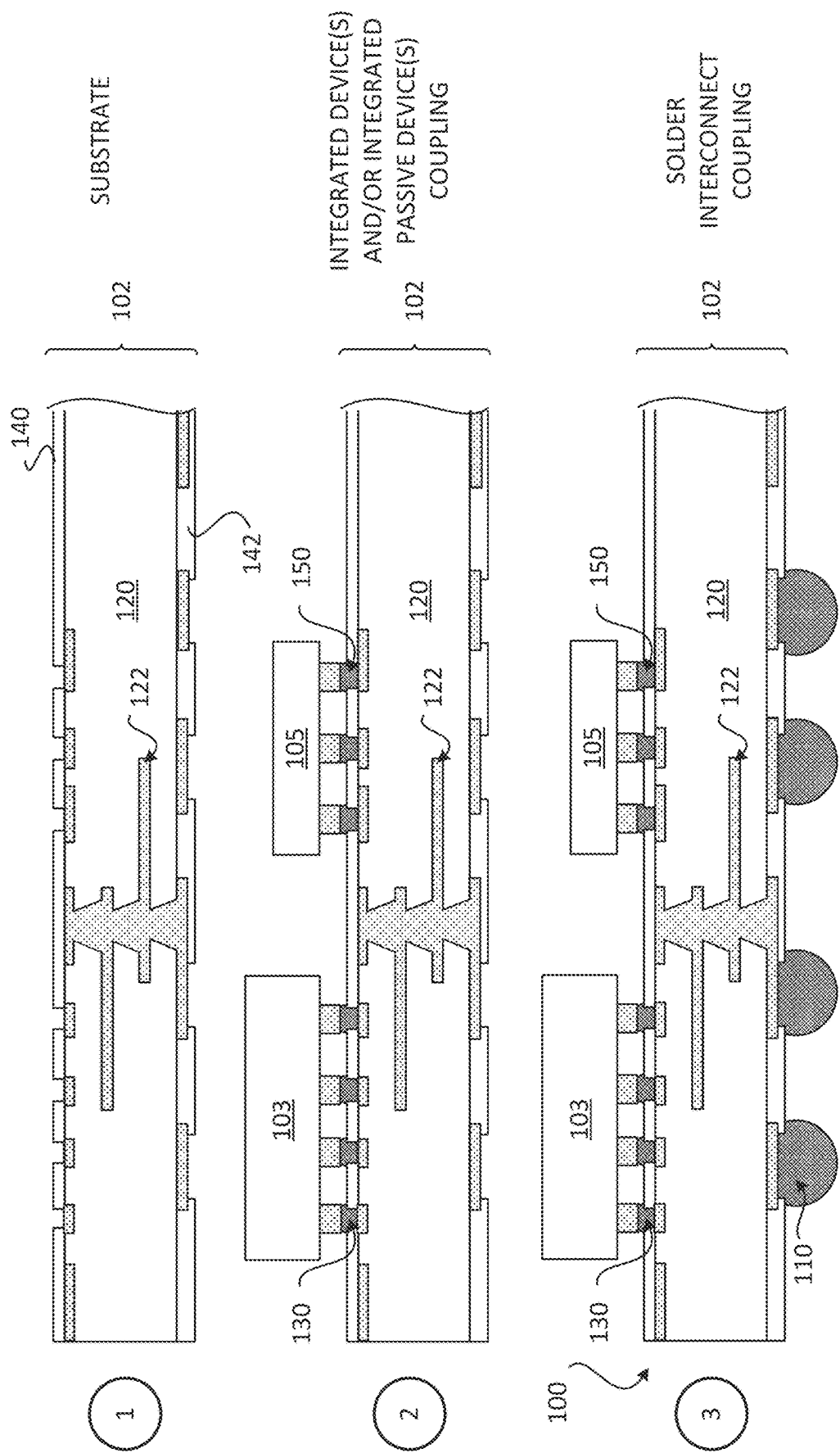
FIG. 13 illustrates an exemplary flow diagram of a method for fabricating a package that includes a substrate, an integrated device and an integrated passive device.

Exemplary Sequence for Fabricating a Package That Includes an Integrated Device and an Integrated Passive Device FIG. 13 illustrates an exemplary sequence for providing or fabricating a package that includes an integrated device comprising a magnetic layer and/or an integrated passive device comprising a magnetic layer. In some implementations, the sequence of FIG. 13 may be used to provide or fabricate the package 100 that includes an integrated device and/or the integrated passive device.

It should be noted that the sequence of FIG. 13 may combine one or more stages in order to simplify and/or clarify the sequence for providing or fabricating the package. In some implementations, the order of the processes may be changed or modified. In some implementations, one or more of processes may be replaced or substituted without departing from the scope of the disclosure. The sequence of FIG. 13 may be used to fabricate one package or several packages at a time (as part of a wafer).

Stage 1, as shown in FIG. 13, illustrates a state after the substrate 102 is provided. The substrate 102 may be provided by a supplier or fabricated. The substrate 102 includes at least one dielectric layer 120 and a plurality of interconnects 122, a solder resist layer 140 and a solder resist layer 142. The substrate 102 may include an embedded trace substrate (ETS). In some implementations, the at least one dielectric layer 120 may include prepreg layer(s).

Stage 2 illustrates a state after the integrated device 103 is coupled to a first surface (e.g., top surface) of the substrate 102. The integrated device 103 may be coupled to the substrate 102 through a plurality of solder interconnects 130. The plurality of solder interconnects 130 are coupled to the plurality of interconnects 122. A solder reflow process may be used to couple the integrated device 103 to the plurality of interconnects 122 through the plurality of solder interconnects 130.

Stage 2 also illustrates a state after the integrated passive device 105 is coupled to the first surface (e.g., top surface) of the substrate 102. The integrated passive device 105 may be coupled to the substrate 102 through a plurality of solder interconnects 150. The plurality of solder interconnects 150 are coupled to the plurality of interconnects 122. A solder reflow process may be used to couple the integrated passive device 105 to the plurality of interconnects 122 through the plurality of solder interconnects 150.

Stage 3 illustrates a state after a plurality of solder interconnects 110 are couped to the substrate 102. The plurality of solder interconnects 110 may be couple to interconnects that are located over a second surface of the at least one dielectric layer 120. A solder reflow process may be used to couple the plurality of solder interconnects 110 to the substrate 102. Stage 3 may illustrate the package 100. The packages (e.g., 100) described in the disclosure may be fabricated one at a time or may be fabricated together as part of one or more wafers and then singulated into individual packages.

Exemplary Flow Diagram of a Method for Fabricating a Package That Includes an Integrated Device and an Integrated Passive Device In some implementations, fabricating a package that includes an integrated device comprising a magnetic layer and/or an integrated passive device comprising a magnetic layer, includes several processes. FIG. 14 illustrates an exemplary flow diagram of a method 1400 for providing or fabricating package that includes an integrated device comprising a magnetic layer and/or an integrated passive device comprising a magnetic layer. In some implementations, the method 1400 of FIG. 14 may be used to provide or fabricate the package 100 of FIG. 1 described in the disclosure. However, the method 1400 may be used to provide or fabricate any of the packages described in the disclosure.

It should be noted that the method of FIG. 14 may combine one or more processes in order to simplify and/or clarify the method for providing or fabricating a package that includes an integrated device comprising a magnetic layer and/or an integrated passive device comprising a magnetic layer. In some implementations, the order of the processes may be changed or modified.

The method provides (at 1405) a substrate (e.g., 102). The substrate 102 may be provided by a supplier or fabricated. The substrate 102 includes at least one dielectric layer 120, and a plurality of interconnects 122. The substrate 102 may include an embedded trace substrate (ETS). In some implementations, the at least one dielectric layer 120 may include prepreg layers. Stage 1 of FIG. 13 illustrates and describes an example of providing a substrate with escape interconnects.

The method couples (at 1410) at least one integrated device (e.g., 103) to the first surface of the substrate (e.g., 102). For example, the integrated device 103 may be coupled to the substrate 102 through the plurality of solder interconnects 130. The plurality of solder interconnects 130 are coupled to the plurality of interconnects 122. A solder reflow process may be used to couple the integrated device 103 to the plurality of interconnects through the plurality of solder interconnects 130.

The method also couples (at 1410) at least one integrated passive device (e.g., 105) to the first surface of the substrate (e.g., 102). For example, the integrated passive device 105 may be coupled to the substrate 102 through the plurality of solder interconnects 150. The plurality of solder interconnects 150 are coupled to the plurality of interconnects 122. A solder reflow process may be used to couple the integrated passive device 105 to the plurality of interconnects through the plurality of solder interconnects 150. Stage 2 of FIG. 13 illustrates and describes an example of an integrated device and an integrated passive device coupled to a substrate.

The method couples (at 1415) a plurality of solder interconnects (e.g., 110) to the second surface of the substrate (e.g., 102). A solder reflow process may be used to couple the plurality of solder interconnects 110 to the substrate. Stage 3 of FIG. 13 illustrates and describes an example of coupling solder interconnects to the substrate.

Exemplary Electronic Devices

Figure 15:
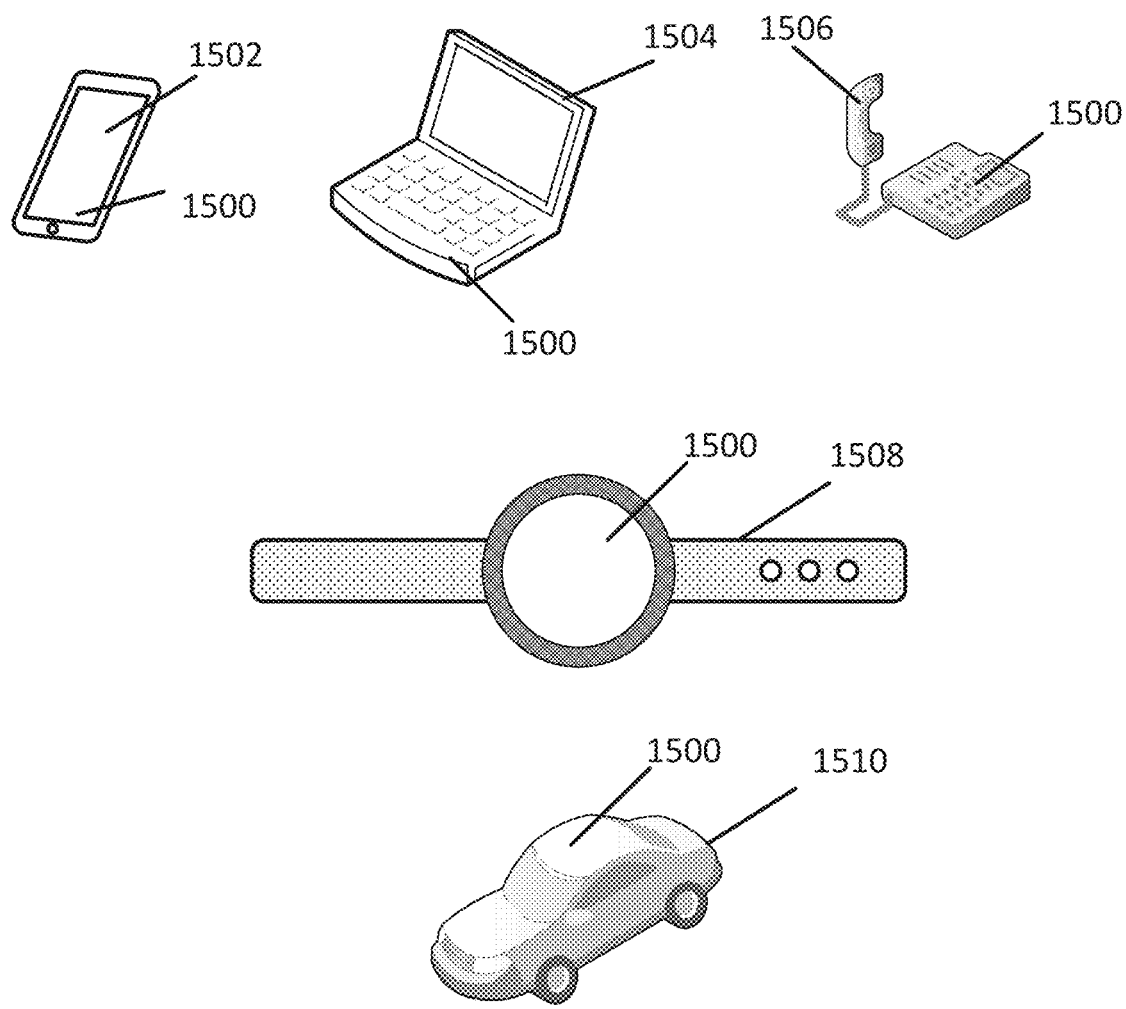
FIG. 15 illustrates various electronic devices that may integrate a die, an electronic circuit, an integrated device, an integrated passive device (IPD), a passive component, a package, and/or a device package described herein.

FIG. 15 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1502, a laptop computer device 1504, a fixed location terminal device 1506, a wearable device 1508, or automotive vehicle 1510 may include a device 1500 as described herein. The device 1500 may be, for example, any of the devices and/or integrated circuit (IC) packages described herein. The devices 1502, 1504, 1506 and 1508 and the vehicle 1510 illustrated in FIG. 15 are merely exemplary. Other electronic devices may also feature the device 1500 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-9, 10A-10I and/or 11-15 may be rearranged and/or combined into a single component, process, feature or function or embodied in several components, processes, or functions. Additional elements, components, processes, and/or functions may also be added without departing from the disclosure. It should also be noted FIGS. 1-9, 10A-10I and/or 11-15 and its corresponding description in the present disclosure is not limited to dies and/or ICs. In some implementations, FIGS. 1-9, 10A-10I and/or 11-15 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component.

The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the disclosure.

Aspect 1: An integrated device comprising a die substrate comprising a plurality of transistors; an interconnection portion coupled to the die substrate; and a packaging portion coupled to the interconnection portion. The interconnection portion comprises at least one die dielectric layer; and a plurality of die interconnects coupled to the plurality of transistors. The packaging portion comprises at least one magnetic layer; and a plurality of metallization interconnects coupled to the plurality of die interconnects.

Aspect 2: The integrated device of aspect 1, wherein the at least one magnetic layer includes an insulating layer and/or a dielectric layer.

Aspect 3: The integrated device of aspects 1 through 2, wherein the at least one magnetic layer includes a non-electrical conducting material.

Aspect 4: The integrated device of aspects 1 through 3, wherein the at least one magnetic layer has a relative permeability value that is greater than 1.

Aspect 5: The integrated device of aspects 1 through 4, wherein the at least one magnetic layer has a magnetic loss tangent value that is in a range of 0.01-0.04.

Aspect 6: The integrated device of aspects 1 through 5, wherein the at least one magnetic layer comprises a first magnetic layer that includes a first permeability value; and a second magnetic layer that includes a second permeability value. The first permeability value may be a first relative permeability value. The second permeability value may be a second relative permeability value.

Aspect 7: The integrated device of aspects 1 through 6, wherein the interconnect portion includes a capacitor that is defined by at least some die interconnects from the plurality of die interconnects.

Aspect 8: The integrated device of aspect 7, wherein the packaging portion includes an inductor that is defined by at least one metallization interconnect from the plurality of metallization interconnects.

Aspect 9: The integrated device of aspects 1 through 8, wherein the packaging portion is a redistribution portion, and wherein the plurality of metallization interconnects include a plurality of redistribution interconnects.

Aspect 10: The integrated device of aspects 1 through 9, wherein the integrated device is a die configured to operate as a power management integrated circuit (PMIC).

Aspect 11: A device comprising a die substrate; an interconnection portion coupled to the die substrate; a packaging portion coupled to the interconnection portion. The interconnection portion comprises at least one die dielectric layer; and a plurality of die interconnects. The packaging portion comprises at least one magnetic layer; and a plurality of metallization interconnects coupled to the plurality of die interconnects.

Aspect 12: The device of aspect 11, wherein the at least one magnetic layer includes an insulating layer, a dielectric layer, and/or a non-electrical conducting material, and wherein the at least one magnetic layer has a relative permeability value that is greater than 1.

Aspect 13: The device of aspects 11 through 12, wherein the at least one magnetic layer comprises a first magnetic layer that includes a first permeability value; and a second magnetic layer that includes a second permeability value. The first permeability value may be a first relative permeability value. The second permeability value may be a second relative permeability value.

Aspect 14: The device of aspects 11 through 13, wherein the interconnect portion includes a capacitor that is defined by at least some die interconnects from the plurality of die interconnects.

Aspect 15: The device of aspect 14, wherein the packaging portion includes an inductor that is defined by at least one metallization interconnect from the plurality of metallization interconnects.

Aspect 16: The device of aspects 11 through 15, wherein the die substrate, the interconnection portion and the packaging portion are part of an integrated passive device (IPD).

Aspect 17: The device of aspects 11 through 16, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 18: A method provides a die substrate. The method forms an interconnection portion over the die substrate, where forming the interconnection portion comprises forming at least one die dielectric layer and forming a plurality of die interconnects. The method forms a packaging portion over the interconnection portion, where forming the packaging portion comprises forming a plurality of metallization interconnects coupled to the plurality of die interconnects and forming at least one magnetic layer.

Aspect 19: The method of aspect 18, wherein the die substrate comprises a plurality of transistors, and wherein the plurality of die interconnects is formed such that the plurality of die interconnects are coupled to the plurality of transistors.

Aspect 20: The method of aspects 18 through 19, wherein the at least one magnetic layer includes an insulating layer, a dielectric layer, and/or a non-electrical conducting material, and wherein the at least one magnetic layer has a relative permeability value that is greater than 1.

Aspect 21: The method of aspects 18 through 20, wherein the interconnect portion includes a capacitor that is defined by at least some die interconnects from the plurality of die interconnects, and wherein the packaging portion includes an inductor that is defined by at least one metallization interconnect from the plurality of metallization interconnects.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. An integrated device comprising:
a die substrate comprising a plurality of transistors;
an interconnection portion coupled to the die substrate, the interconnection portion comprising:
at least one die dielectric layer;
a plurality of die interconnects coupled to the plurality of transistors; and
a passivation layer coupled to the at least one die dielectric layer; and
a packaging portion coupled to the interconnection portion, the packaging portion comprising:
at least one magnetic layer; and
a plurality of metallization interconnects coupled to the plurality of die interconnects,
wherein the passivation layer is located (i) between the die substrate and the plurality of metallization interconnects and (ii) between the die substrate and the at least one magnetic layer.

2. The integrated device of claim 1, wherein the at least one magnetic layer includes an insulating layer and/or a dielectric layer.

3. The integrated device of claim 1, wherein the at least one magnetic layer includes a non-electrical conducting material.

4. The integrated device of claim 1, wherein the at least one magnetic layer has a relative permeability value that is greater than 1.

5. The integrated device of claim 1, wherein the at least one magnetic layer has a magnetic loss tangent value that is in a range of 0.01-0.04.

6. The integrated device of claim 1, wherein the at least one magnetic layer comprises:
a first magnetic layer that includes a first permeability value; and
a second magnetic layer that includes a second permeability value.

7. The integrated device of claim 1,
wherein the packaging portion is a redistribution portion, and
wherein the plurality of metallization interconnects include a plurality of redistribution interconnects.

8. The integrated device of claim 1, wherein the integrated device is a die configured to operate as a power management integrated circuit (PMIC).

9. The integrated device of claim 1,
wherein the packaging portion includes an inductor that is defined by at least one metallization interconnect from the plurality of metallization interconnects, and
wherein the at least one magnetic layer laterally and completely surrounds and touches at least metallization interconnect that defines the inductor.

10. The integrated device of claim 1,
wherein the packaging portion further includes a second passivation layer,
wherein the at least one magnetic layer is located between the passivation layer and the second passivation layer, and
wherein the passivation layer and the second passivation are separate passivation layers.

11. The integrated device of claim 1, wherein the at least magnetic layer extends laterally along at least a majority of a lateral width of the integrated device.

12. An integrated device comprising:
a die substrate comprising a plurality of transistors;
an interconnection portion coupled to the die substrate, the interconnection portion comprising:
at least one die dielectric layer;
a plurality of die interconnects coupled to the plurality of transistors; and
a capacitor that is defined by at least some die interconnects from the plurality of die interconnects; and
a packaging portion coupled to the interconnection portion, the packaging portion comprising:
at least one magnetic layer; and
a plurality of metallization interconnects coupled to the plurality of die interconnects.

13. The integrated device of claim 12, wherein the packaging portion includes an inductor that is defined by at least one metallization interconnect from the plurality of metallization interconnects.

14. A device comprising:
a die substrate;
an interconnection portion coupled to the die substrate, the interconnection portion comprising:
at least one die dielectric layer;
a plurality of die interconnects; and
a passivation layer coupled to the at least one die dielectric layer; and
a packaging portion coupled to the interconnection portion, the packaging portion comprising:
a plurality of metallization interconnects coupled to the plurality of die interconnects; and
at least one magnetic layer that laterally surrounds at least one metallization interconnect from the plurality of metallization interconnects,
wherein the passivation layer is located (i) between the die substrate and the plurality of metallization interconnects and (ii) between the die substrate and the at least one magnetic layer.

15. The device of claim 14,
wherein the at least one magnetic layer includes an insulating layer, a dielectric layer and/or a non-electrical conducting material, and
wherein the at least one magnetic layer has a relative permeability value that is greater than 1.

16. The device of claim 14, wherein the at least one magnetic layer comprises:
a first magnetic layer that includes a first permeability value; and
a second magnetic layer that includes a second permeability value.

17. The device of claim 14, wherein the interconnect interconnection portion includes a capacitor that is defined by at least some die interconnects from the plurality of die interconnects.

18. The device of claim 17,
wherein the packaging portion includes an inductor that is defined by at least one metallization interconnect from the plurality of metallization interconnects, and
wherein the at least one magnetic layer laterally and completely surrounds and touches, at least metallization interconnect that is part of the inductor.

19. The device of claim 14, wherein the die substrate, the interconnection portion and the packaging portion are part of an integrated passive device (IPD).

20. The device of claim 14, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

21. A method comprising:
providing a die substrate;
forming an interconnection portion over the die substrate, wherein forming the interconnection portion comprises:
forming at least one die dielectric layer;
forming a plurality of die interconnects; and
forming a passivation layer that is coupled to the at least one die dielectric layer; and
forming a packaging portion over the interconnection portion, wherein forming the packaging portion comprises:
forming a plurality of metallization interconnects coupled to the plurality of die interconnects; and
forming at least one magnetic layer,
wherein the plurality of metallization interconnects and the at least one magnetic layer are formed such that the passivation layer is located (i) between the die substrate and the plurality of metallization interconnects and (ii) between the die substrate and the at least one magnetic layer.

22. The method of claim 21,
wherein the die substrate comprises a plurality of transistors, and
wherein the plurality of die interconnects is formed such that the plurality of die interconnects are coupled to the plurality of transistors.

23. The method of claim 21,
wherein the at least one magnetic layer includes an insulating layer, a dielectric layer, and/or a non-electrical conducting material, and
wherein the at least one magnetic layer has a relative permeability value that is greater than 1.

24. The method of claim 21,
wherein the interconnection portion includes a capacitor that is defined by at least some die interconnects from the plurality of die interconnects, and
wherein the packaging portion includes an inductor that is defined by at least one metallization interconnect from the plurality of metallization interconnects.

\* \* \* \* \*